(12) United States Patent
Saitoh et al.

(10) Patent No.: US 7,463,662 B2
(45) Date of Patent: Dec. 9, 2008

(54) OPTICAL SEMICONDUCTOR DEVICE, MANUFACTURING METHOD THEREFOR, AND OPTICAL SEMICONDUCTOR APPARATUS

(75) Inventors: Kazunori Saitoh, Maruko (JP); Hiroshi Hamada, Komoro (JP)

(73) Assignee: Opnext Japan, Inc., Kanagawa (JP)

( * ) Notice: Subject to any disclaimer, the term of this patent is extended or adjusted under 35 U.S.C. 154(b) by 0 days.

(21) Appl. No.: 11/349,172

(22) Filed: Feb. 8, 2006

(65) Prior Publication Data

US 2006/0222030 A1    Oct. 5, 2006

(30) Foreign Application Priority Data

Mar. 29, 2005  (JP)  ............................. 2005-094854

(51) Int. Cl.
    *H01S 5/00* (2006.01)
(52) U.S. Cl. ................................. 372/46.01; 372/45.01
(58) Field of Classification Search .............. 372/46.01, 372/43, 45
    See application file for complete search history.

(56) References Cited

U.S. PATENT DOCUMENTS

| | | | | |
|---|---|---|---|---|
| 5,208,821 | A * | 5/1993 | Berger et al. ........... | 372/46.012 |
| 6,614,821 | B1 * | 9/2003 | Jikutani et al. ........... | 372/43.01 |
| 6,646,975 | B1 * | 11/2003 | Uchizaki et al. ........... | 369/121 |
| 6,807,213 | B1 * | 10/2004 | Shimoyama et al. ..... | 372/49.01 |
| 2004/0208211 | A1 * | 10/2004 | Maruyama et al. ......... | 372/38.1 |
| 2004/0218646 | A1 * | 11/2004 | Mihashi et al. ............... | 372/46 |

FOREIGN PATENT DOCUMENTS

JP    2003-218469    1/2002

* cited by examiner

*Primary Examiner*—Minsun Harvey
*Assistant Examiner*—Patrick Stafford
(74) *Attorney, Agent, or Firm*—Reed Smith LLP; Stanley P. Fisher, Esq.; Juan Carlos A. Marquez, Esq.

(57) ABSTRACT

A highly reliable optical semiconductor device insusceptible to degradation in the characteristics thereof. An n-type buffer layer, n-type first cladding layer, active layer, a p-type first layer of the second cladding layer, p-type etch-stop layer, p-type second layer of the second cladding layer, and p-type contact layer are formed an n-type semiconductor substrate. Two lengths of separation grooves are formed in parallel in such a way as to reach the underside of the p-type second layer of the second cladding layer from the top face of the contact layer, and a ridge is formed between the respective separation grooves. The ridge comprises a lower portion thereof, made up of the second layer of the second cladding layer, and a portion of the contact layer, corresponding to the ridge, made up of the contact layer. Side parts of the top face of the portion of the contact layer, corresponding to the ridge, facing the separation grooves, respectively, are turned to tilted faces, respectively, and a barrier metal layer is formed on top of the tilted faces. Portions extending from side faces of the lower portion of the ridge to run across the respective separation grooves are covered with an insulating film. Since the tilted faces are formed at the respective side parts of the top face of the portion of the contact layer, no stepping occurs to the barrier metal layer. Accordingly, Au of an Au layer formed outside of the barrier metal layer is prevented from being diffused into the portion of the contact layer, corresponding to the ridge, made of GaAs, through steeped parts of the barrier metal layer.

14 Claims, 12 Drawing Sheets

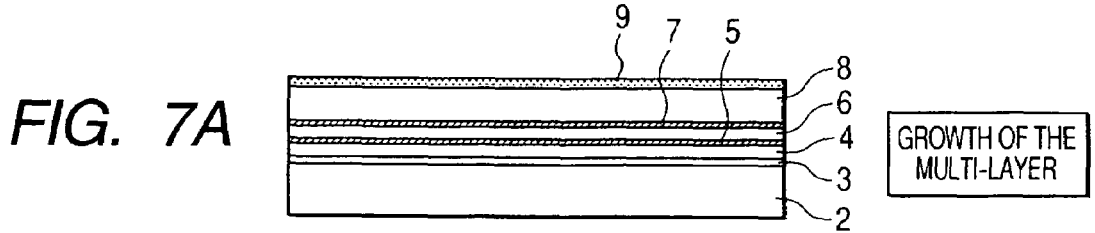
FIG. 7A — GROWTH OF THE MULTI-LAYER
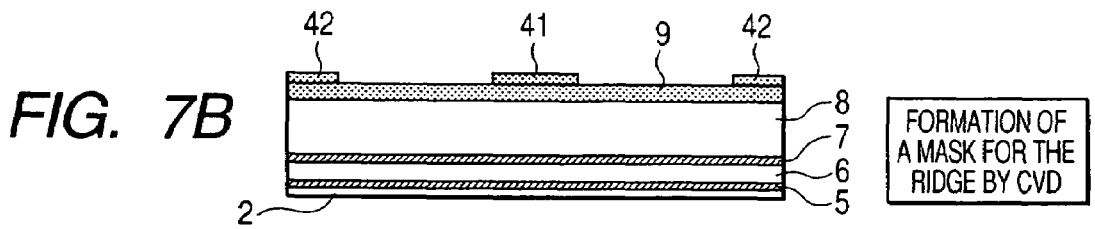
FIG. 7B — FORMATION OF A MASK FOR THE RIDGE BY CVD
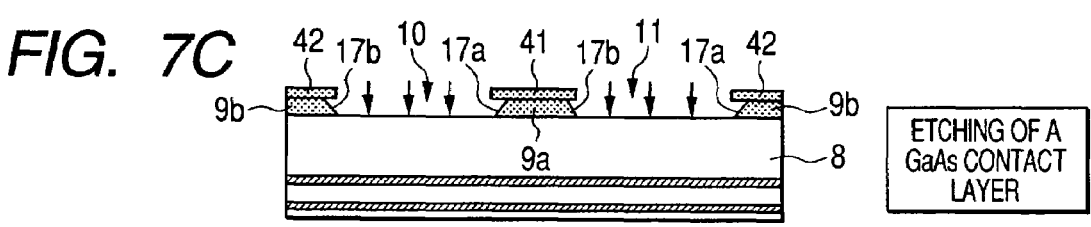
FIG. 7C — ETCHING OF A GaAs CONTACT LAYER
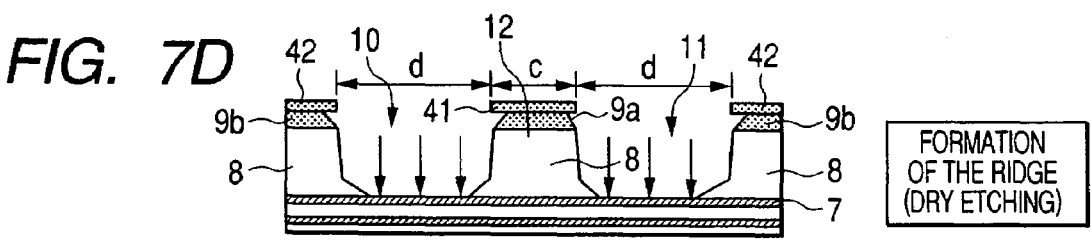
FIG. 7D — FORMATION OF THE RIDGE (DRY ETCHING)
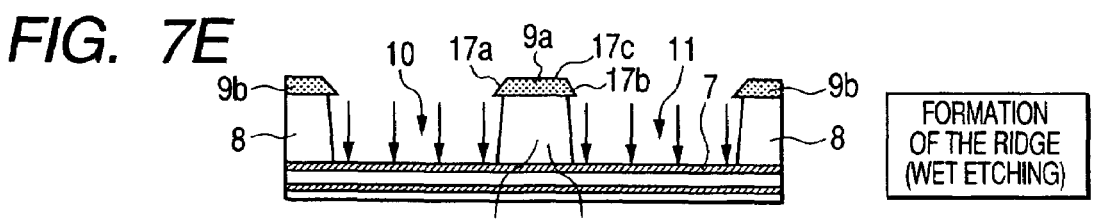
FIG. 7E — FORMATION OF THE RIDGE (WET ETCHING)
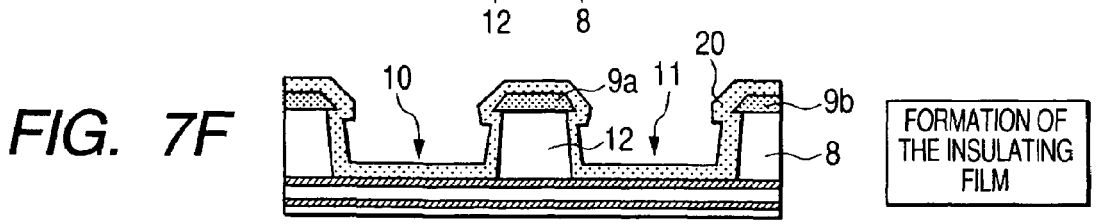
FIG. 7F — FORMATION OF THE INSULATING FILM
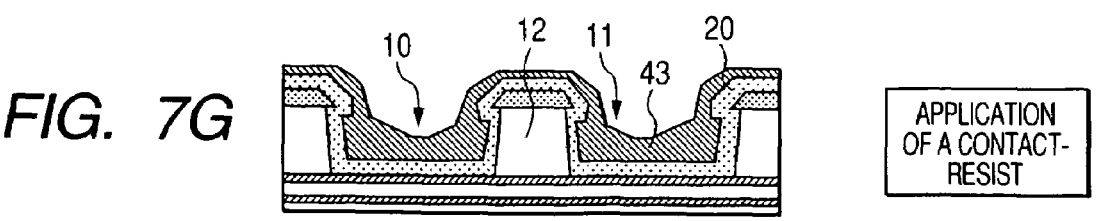
FIG. 7G — APPLICATION OF A CONTACT-RESIST

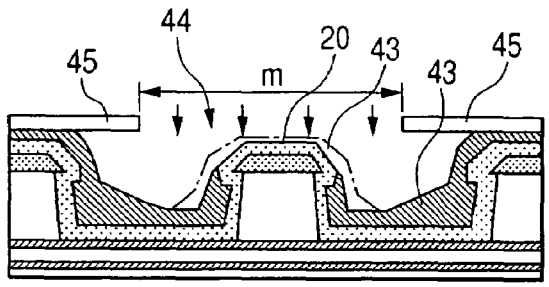
FIG. 8A — EXPOSURE-DEVELOPMENT OF THE CONTACT-RESIST
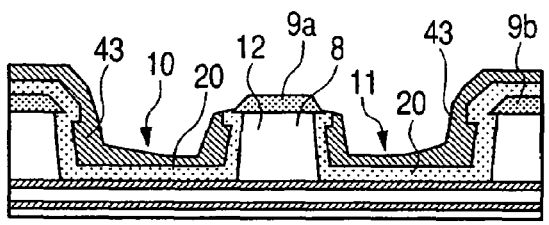
FIG. 8B — FORMATION OF THE CONTACT HOLE (DRY ETCHING OF THE CVD FILM)
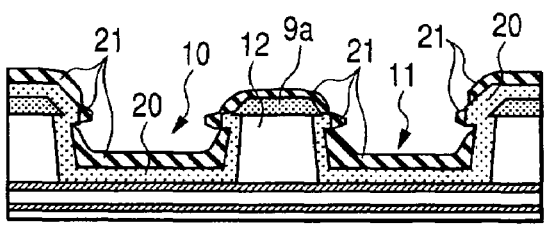
FIG. 8C — FORMATION OF THE BARRIER METAL LAYER
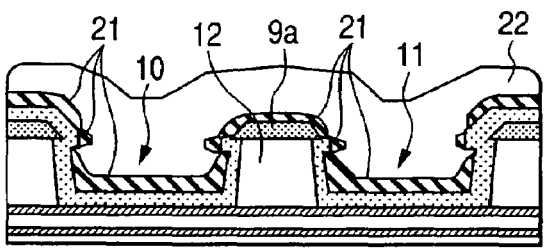
FIG. 8D — FORMATION OF THE FIRST ELECTRODE
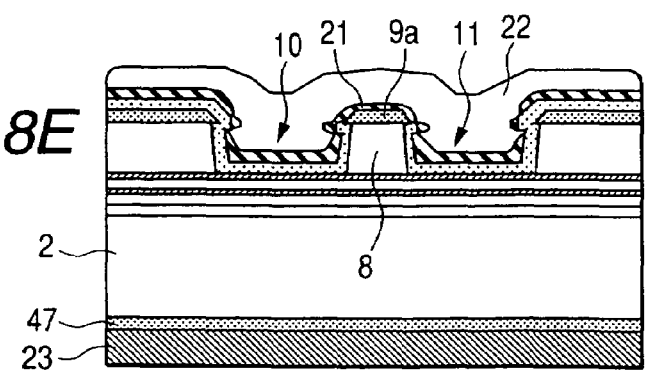
FIG. 8E — GRINDING OF A SUBSTRATE-FORMATION OF THE SECOND ELECTRODE

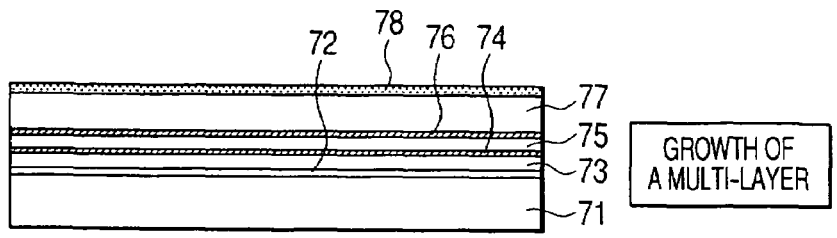
FIG. 13A — GROWTH OF A MULTI-LAYER
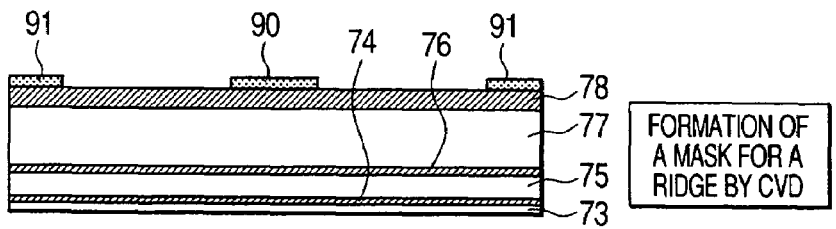
FIG. 13B — FORMATION OF A MASK FOR A RIDGE BY CVD
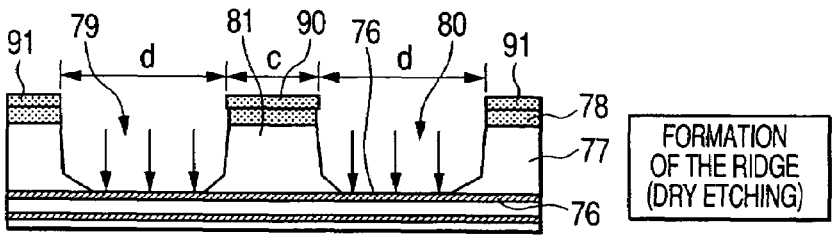
FIG. 13C — FORMATION OF THE RIDGE (DRY ETCHING)
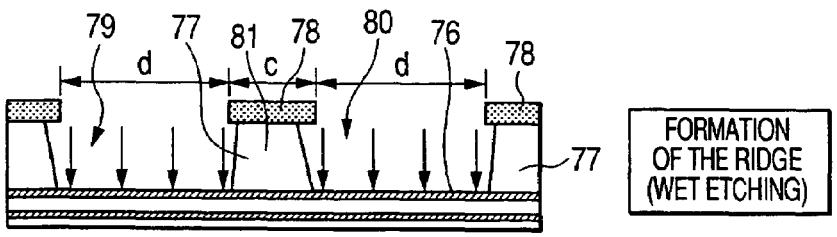
FIG. 13D — FORMATION OF THE RIDGE (WET ETCHING)
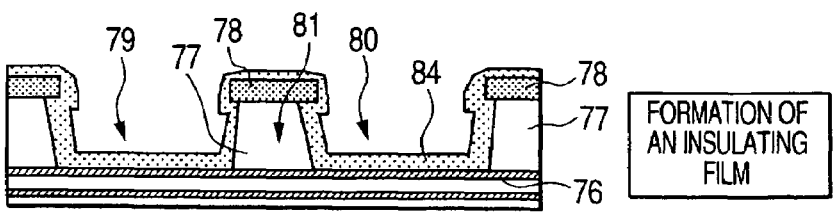
FIG. 13E — FORMATION OF AN INSULATING FILM
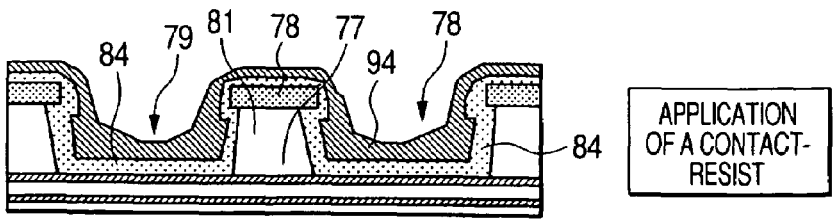
FIG. 13F — APPLICATION OF A CONTACT-RESIST

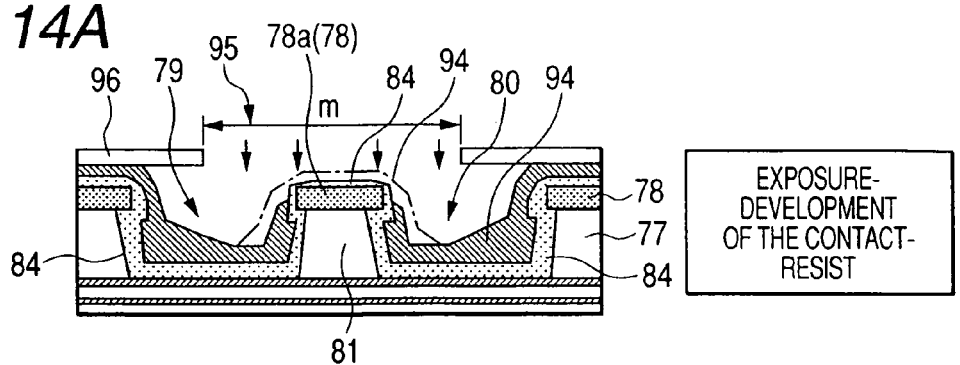
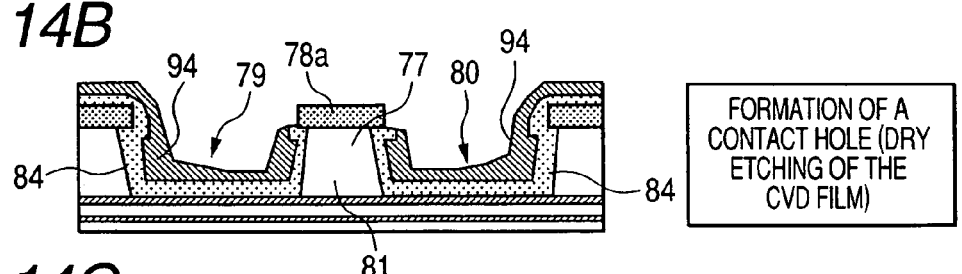
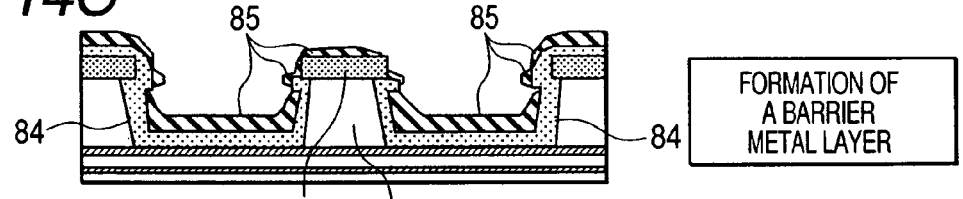
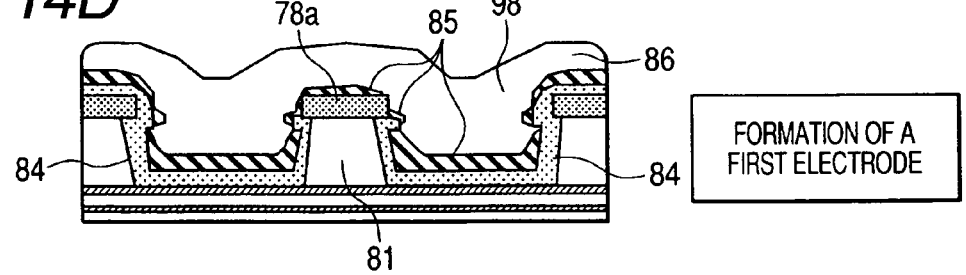
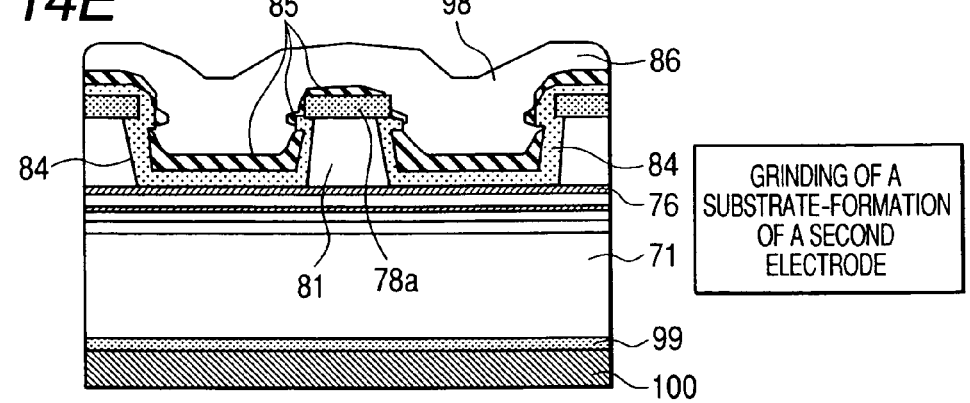

OPTICAL SEMICONDUCTOR DEVICE, MANUFACTURING METHOD THEREFOR, AND OPTICAL SEMICONDUCTOR APPARATUS

CLAIM OF PRIORITY

The present application claims priority from Japanese application JP 2005-094854 filed on Mar. 29, 2005, the content of which is hereby incorporated by reference into this application.

FIELD OF THE INVENTION

The invention relates to an optical semiconductor device, a manufacturing method therefor, and an optical semiconductor apparatus with the optical semiconductor device assembled therein, and is concerned with a technology effective for application to, for example, a manufacturing technology for a laser diode (LD) of a ridge structure.

BACKGROUND OF THE INVENTION

A semiconductor laser device (LD) as an optical semiconductor device is heavily used as a light source of an optical communications system, and a light source of information processing equipment. A visible semiconductor laser is used as a light source of the information processing equipment such as a CD player, DVD player, laser printer, POS, bar code reader, document file system, and so forth. A so-called ridge structure is known as one of structures for the semiconductor laser device (the optical semiconductor device) (for example, JP-A No. 218469/2003).

A semiconductor laser apparatus described in JP-A No. 218469/2003 is a nitride-based semiconductor apparatus of a ridge-stripe structure. The semiconductor laser apparatus has a structure wherein an n-type GaN buffer layer, a modulation-doped superlattice n-type cladding layer, an n-type GaN optical waveguide layer, a multiple quantum well active layer, a p-type GaN optical waveguide layer, a modulation-doped superlattice p-type cladding layer, and p-GaN contact layer are caused to undergo multiple-layer growth over an n-type GaN semiconductor substrate. Those multi-layer growth layers are formed by an organometallic chemical vapor deposition method (MOCVD). In forming the multi-layer growth layers, the n-type GaN buffer layer is caused to undergo growth over the n-type GaN semiconductor substrate by the MOCVD. Subsequently, the n-type cladding layer, n-type GaN optical waveguide layer, multiple quantum well active layer, p-type GaN optical waveguide layer, p-type cladding layer, and p-GaN contact layer are caused to undergo sequential growth by the MOCVD.

Further, in order to form a ridge stripe, portions of the multi-layer growth layers, down to halfway through the modulation-doped superlattice p-type cladding layer, are removed by a dry etching method, and an $SiO_2$ insulating film is formed on a surface exposed after such removal as described. Thereafter, an $SiO_2$ insulating film over the p-GaN contact layer that is the uppermost layer of a ridge is partially removed, and a p-side electrode made of Pt is formed in removed portions of the $SiO_2$ insulating film, a p-side electrode pad for wiring, made of Ti/Pt/Au, being further formed in the removed portions.

SUMMARY OF THE INVENTION

While a high output and long service life are required of a semiconductor laser device (LD) for use in DVD, and so forth, there is a demand for reduction in price thereof.

In the manufacture of the semiconductor laser device of a ridge structure, the formation of multi-layer growth layers is implemented by processing using the MOCVD executed a plurality of times, so that a manufacturing cost of the semiconductor laser device becomes high.

With the semiconductor laser device described in JP-A No. 218469/2003, a contact hole is formed in an insulating film covering the top part (top face) of the ridge by use of photo-lithographic techniques and etching techniques in order to electrically connect a semiconductor layer in the uppermost layer of the ridge to an electrode (a p-side electrode). Because a ridge width is as narrow as 2 μm, highly accurate photo-lithographic techniques (exposure-development of a photo resist) and etching techniques are requited in order to cause the contact hole to be aligned with the center of the top part of the ridge, which is undesirable from the viewpoint of enhancement in production yield and productivity.

Accordingly, the inventor has conducted studies on a technology for manufacturing the semiconductor laser device, whereby the multi-layer growth layers are formed by processing using the MOCVD to be executed only once in order to simplify a manufacturing process.

FIGS. 11 to 14 each are schematic views concerning the semiconductor laser device, and a manufacturing method therefor, as studied by the inventor prior to development of the present invention. FIG. 11 is a partially sectional view showing the outline of the semiconductor laser device, and FIG. 12 is an enlarged sectional view showing a part of the semiconductor laser device shown in FIG. 11. FIG. 13 is a schematic sectional view of a semiconductor substrate in the respective steps of the manufacturing method for the semiconductor laser device, showing from a multi-layer growth step up to an Au plating forming step. FIG. 14 is a schematic sectional view of the semiconductor substrate in the manufacturing method for the semiconductor laser device, showing coverage property of a barrier metal layer formed on top of a GaAs contact layer.

As shown in the schematic view of FIG. 11, a semiconductor laser device 70 has multi-layer growth layers made of compound semiconductors, over a first face (the upper surface in FIG. 11) of a semiconductor substrate 71. The multi-layer growth layers have an n-type buffer layer 72, an n-type cladding layer 73 (a first cladding layer), an active layer 74, a p-type cladding layer (a first layer of a second cladding layer) 75, a p-type etch-stop layer 76, a p-type cladding layer (a second layer of the second cladding layer) 77, and a p-type contact layer 78, those layers being sequentially formed over the first face of the semiconductor substrate 71. The semiconductor substrate 71 is made up of a GaAs substrate, the n-type buffer layer 72 is made up of a GaAs layer, the n-type cladding layer 73 is made up of an AlGaInP layer, the active layer 74 is a semiconductor layer of a multiple quantum well structure comprising a barrier layer made up of an AlGaInP layer, and a well layer made up of a GaInP layer, the p-type cladding layer 75 is made up of an AlGaInP layer, the etch-stop layer 76 is made up of a GaInP layer, and the p-type cladding layer 77 is made up of a GaAs layer, respectively.

The first face of the semiconductor substrate 71, with the multi-layer growth layers formed thereon, is a crystal face tilted substantially by an angle θ from the crystal face (001) of a GaAs crystal (refer to FIG. 15). The angle θ is 10°, so that the first face of the semiconductor substrate 71 is <001> in crystal orientation.

The multi-layer growth layers are structured such that two lengths of separation grooves 79, 80 are formed on a side of the semiconductor substrate 71, adjacent to the first face, in such a way as to reach the underside of the p-type cladding layer (the second layer of the second cladding layer) 77 from the upper face of the contact layer 78, and the respective bottoms of the separation grooves 79, 80 are formed with the etch-stop layer 76. Portions of the multi-layer growth layers, sandwiched between the two lengths of the separation grooves 79, 80, constitute a ridge (rib) 81 in a stripe-like shape. The ridge 81 has a width on the order of 2 μm.

An insulating film 84 covering portions of the semiconductor laser device 70, extending from respective side faces 82, 83 of the ridge 81, facing the separation grooves 79, 80, and including the separation grooves 79, 80, before running across the separation grooves 79, 80, respectively, to reach respective side edges of the semiconductor substrate is provided on the first face side of the semiconductor substrate (refer to FIG. 12). Further, a barrier metal layer 85 made of a metal is formed on the first face side of the semiconductor substrate. The barrier metal layer 85 covers the ridge 81, and the separation grooves 79, 80. Further, an Au plating layer 98 composed of Au is formed so as to overlie the barrier metal layer 85, thereby forming a first electrode (p-electrode) 86. A second electrode (an n-electrode), although not shown, is provided on a second face of the semiconductor substrate 71, that is, a face on a side thereof, opposite from the first face.

With the semiconductor laser device 70 described as above, by applying a predetermined voltage to the first electrode (p-electrode) 86, and the second electrode (n-electrode), respectively, a laser beam is emitted from respective end faces of the semiconductor laser device 70, in a direction orthogonal to a direction in which the ridge 81 is extended. Flow of an electric current causes a stripe-like portion of the active layer, corresponding to the ridge 81, to act as an optical waveguide (resonator), and an emitting face for emitting the laser beam is formed at respective ends of the optical waveguide.

FIGS. 13A to 13F and FIGS. 14A to 14E are views showing the semiconductor substrate and so forth in the respective steps of the manufacturing method for the semiconductor laser device 70. FIGS. 13A to 13F are schematic views of the semiconductor substrate and so forth in the respective steps for growth of a multi-layer, formation of a mask for the ridge by CVD, formation of the ridge (dry etching), formation of the ridge (wet etching), formation of the insulating film, and application of a contact-resist. Further, FIGS. 14A to 14E are schematic views showing the semiconductor substrate and so forth in the respective steps for exposure·development of the contact-resist, formation of a contact hole (dry etching of a CVD film), formation of the barrier metal layer, formation of the first electrode, and grinding of a substrate·formation of the second electrode.

In the step for growth of the multi-layer, shown in FIG. 13A, the n-type buffer layer 72, n-type cladding layer 73, active layer 74, p-type cladding layer 75, p-type etch-stop layer 76, p-type cladding layer 77, and p-type contact layer 78 are formed to respective predetermined thicknesses by one processing using the MOCVD (the organometallic chemical vapor deposition method) over the first face of the semiconductor substrate 71 made up of an n-type GaAs substrate. For example, the n-type buffer layer 72 is 0.5 μm thick, the n-type cladding layer 73 is 2.0 μm thick, the active layer 74 is 0.04 μm thick, the p-type cladding layer 75 is 0.3 μm thick, the p-type etch-stop layer 76 is 5 nm thick, the p-type cladding layer 77 is 1.2 μm thick, and the p-type contact layer 78 is 0.4 μm thick.

Subsequently, in the step for formation of a mask for the ridge by CVD, shown in FIG. 13B, an SiO$_2$ film, for example, 400 nm thick is formed on the top face of the contact layer 78 by a CVD method. Thereafter, the SiO$_2$ film is patterned by usual photolithographic techniques and etching techniques to thereby form an etching mask 90 for forming the ridge in a stripe-like (band-like) shape in order to form the ridge 81, and etching masks 91 for fields, away from the etching mask 90 by a predetermined distance, respectively.

Subsequently, as shown in FIG. 13C, portions of the contact layer 78 and the p-type cladding layer 77, respectively, are etched by dry etching with the use of the etching mask 90 for forming the ridge, and the etching masks 91 for the fields, serving as masks, to thereby form the two lengths of the separation grooves 79, 80. Respective bottom faces of the separation grooves 79, 80 are formed with the p-type etch-stop layer 76. The portions of the multi-layer growth layers, sandwiched between the two lengths of the separation grooves 79, 80, become the ridge 81 in the band-like (stripe-like) shape. For example, the ridge 81 has a width (c) of 2 μm. Further, the separation grooves 79, 80 each have a width d of 10 μm. The etching mask 90 for forming the ridge has a width (c) of 2 μm as well.

Because sufficient etching of respective bottom corners of the separation grooves 79, 80 cannot be implemented by the dry etching, wet etching is applied as shown in shown in FIG. 13D, thereby forming the ridge 81 square in sectional shape.

Subsequently, after removal of the etching mask 90 for forming the ridge, and the etching masks 91 for the field, the insulating film 84 is formed in such a way as to cover the ridge 81, the separation grooves 79, 80, and so forth by the CVD method as shown in FIG. 13E. The insulating film 84 is made up of an SiO$_2$ film, for example, 200 nm thick.

Subsequently, in order to form the contact hole for connection between a portion of the contact layer 78 (a contact layer 78a of the ridge), constituting an upper part of the ridge 81, and the electrode, a contact-resist 94 is applied so as to cover the entire region including the ridge 81, the separation grooves 79, 80, and so forth, as shown in FIG. 13F.

Subsequently, as shown in FIG. 14A, there is formed a photo mask 96 having an opening 95 such that the ridge 81 is positioned therein by the usual photolithographic techniques and etching techniques. Then, exposure and development are applied to the contact-resist 94 with the use of the photo mask 96 as a mask. By so doing, a portion of the contact-resist 94, on top of the ridge 81, is removed to thereby expose a portion of the insulating film 84, on top of the contact layer 78a of the ridge. Further, by forming the photo mask 96 such that the opening 95 has a width m on the order of 12 μm, larger than the width c of the ridge 81, even portions of the insulating film 84, covering respective side portions of the contact layer 78a of the ridge are exposed. In this connection, in FIG. 14A, the photo mask 96 is shown to be in as-floated state over the separation grooves 79, 80, respectively, for the sake of clarity; however, in an actual structure, the photo mask 96 is in close contact with the contact-resist 94.

Subsequently, after removal of the photo mask 96, in the step of forming the contact hole, the portion of the insulating film 84, exposed on top of the ridge 81, is removed by dry etching. By so doing, there is exposed the contact layer 78a of the ridge, rectangular in sectional shape.

Subsequently, as shown in FIG. 14C, the barrier metal layer 85 is formed by vapor deposition in such a way as to cover the ridge 81, the separation grooves 79, 80, and so forth.

This is because the first electrode (p-electrode) 86 is made of Au, and degradation in the characteristics of a semiconductor laser, due to diffusion of the Au into the contact layer 78a of the ridge, should be prevented. To take an example, with the vapor deposition, respective layers of Ti, Pt, and Au are vapor-deposited in that order. The Pt layer and Ti layer each act as a barrier for blocking contact between the contact layer 78a of the ridge, and Au, and as the Au layer is formed by applying gold plating on those layers in a subsequent step, those layers are provided as substrate metals. The Ti layer is 0.05 μm thick, the Pt layer is 0.1 μm thick, and the Au layer is 0.3 μm thick.

Subsequently, as shown in FIG. 14D, by applying gold plating, the Au-plating layer 98 is formed on the barrier metal layer 85 to thereby form the first electrode (p-electrode). The Au-plating layer 98 is formed to a thickness of, for example, 3.5 μm so as to be integral with the Au layer 0.3 μm thick, formed by the vapor deposition.

Subsequently, as shown in FIG. 14E, the second face of the semiconductor substrate 71 is ground by a predetermined thickness, so that the semiconductor substrate 71 is formed to have a predetermined thickness. Thereafter, after formation of a substrate electrode 99 on the second face of the semiconductor substrate 71 by vapor deposition, an Au-plating layer is formed by plating applied on top of the substrate electrode 99 to thereby form the second electrode (the n-electrode) 100. The second electrode (an n-electrode) 100 is formed to a thickness of, for example, 3.5 μm.

Thus, the semiconductor laser device 70 is formed. In practical manufacturing of the same, use is made of a semiconductor substrate wide in area, called a wafer, and a plurality of the semiconductor substrates, each in such a sectional structure as shown in FIG. 14E, are formed in parallel. Thereafter, the wafer is divided at predetermined intervals in a direction along the ridge 81 to thereby form strip-like pieces thereof. Further, the strip-like pieces each are cleaved at predetermined intervals, thereby fabricating a plurality of the semiconductor substrates 71.

FIGS. 11 to 14 are views each for describing the semiconductor laser device in an undesirable state. More specifically, FIG. 15 is an enlarged schematic view of the ridge 81 shown in FIG. 11. With the semiconductor substrate 71 manufactured by the method shown in FIGS. 13A through 14E, it has been found out that corners of the top face of the contact layer 78a of the ridge are not covered with the barrier metal layer 85, and protrude out of the barrier metal layer 85, as show in FIG. 15, coming into contact with the first electrode (p-electrode) 86 made of Au, thereby causing the Au to be diffused into the contact layer 78a of the ridge.

The inventor has conducted analyses and reviews on occurrence of such a fault, and as a result, has obtained the following knowledge. In fabrication of the barrier metal layer 85 in the course of manufacturing the semiconductor laser device 70, vapor deposition is executed with a wafer placed on a table of a vapor deposition system, in a state of a planetary motion. Although vapor from a vapor deposition source is fed from one direction, the wafer undergoes rotation while revolving due to the planetary motion, so that the vapor deposition should be applied equally and evenly to respective parts of the wafer.

However, a first face of the wafer, on which the multi-layer growth layers are to be formed, that is, the first face of the semiconductor substrate 71, is the crystal face tilted substantially by the angle θ (100) from the crystal face (001) of the GaAs crystal in order to enhance the characteristics of the semiconductor laser device 70. As a result, as shown in FIG. 15, respective side faces of the contact layer 78a of the ridge, each are also a tilted face that is tilted substantially by the angle θ from a base line 101 at an angle of 90° from the first face of the semiconductor substrate 71,. Accordingly, with angles of the corners of the top face of the contact layer 78a of the ridge, on the respective sides thereof, one (the left-hand side in the figure) thereof becomes an obtuse angle, and the other (the right-hand side in the figure) thereof becomes an acute angle. It has turned out that the corner with the acute angle consequently becomes eave-like in shape to thereby cause the barrier metal layer 85 to be discontinuous with other parts thereof, and is prone to be in as-stepped state as indicated by the arrow A in the figure to be thereby cut off from the other parts. Furthermore, since portions of the insulating film 84, facing upper side parts of the ridge 81, respectively, are structured so as to jut out outward, stepping of the barrier metal layer 85 is prone to occur at those portions as well. The barrier metal layer 85 is a layer formed by sequentially overlaying a Ti layer of, for example, 0.04 μm, a Mo layer of, for example, 0.04 μm, and a Ti layer of, for example, 0.04 μm, one on another, or a layer formed by sequentially overlaying a Ti layer of 0.05 μm, and a Pt layer of 0.1 μm. In any case, as the barrier metal layer 85 is small in thickness, stepping is prone to occur thereto. The reason why the barrier metal layer 85 is formed to such a small thickness lies in concern about degradation in the characteristics of the semiconductor laser device 70, due to difference in thermal expansion coefficient between the crystal and barrier metal.

It is therefore an object of the invention to provide a highly reliable optical semiconductor device insusceptible to degradation in the characteristics thereof, and, a manufacturing method therefor, and an optical semiconductor apparatus with the optical semiconductor device assembled therein.

Another object of the invention is to provide a technology for manufacturing an optical semiconductor device having a ridge positioned on an optical waveguide, the optical semiconductor device being structured so as to prevent gold from being diffused into the ridge made up of a semiconductor layer.

Still another object of the invention is to reduce a product cost by simplifying a manufacturing process.

The above and other objects, novel features of the present invention will be apparent from the following detailed description of the preferred embodiment of the invention in conjunction with the accompanying drawings.

A representative embodiment of the invention, disclosed under the present application, is summarized as follows.

(1) The invention provides an optical semiconductor device comprising:
   a semiconductor substrate made up of a GaAs substrate of a first conductivity type, having a first face, and a second face that is a face on a side of the semiconductor substrate, opposite from the first face;
   a first cladding layer made up of a semiconductor layer (an AlGaInP layer) of the first conductivity type, formed over the first face of the semiconductor substrate;
   an active layer formed on top of the first cladding layer, having a multiple quantum well structure comprising an AlGaInP layer serving as a barrier layer, and a GaInP layer serving as a well layer;
   a second cladding layer made up of a semiconductor layer (an AlGaInP layer) of a second conductivity type (p-type), formed on top of the active layer
   a contact layer made up of a semiconductor layer (a GaAs layer) of the second conductivity type, formed over the second cladding layer;
   two lengths of separation grooves each provided in such a way as to extend from the top face of the contact layer to reach an intermediate layer of the second cladding layer, thereby separating respective portions of the contact layer, and the second cladding layer, from each other;

a ridge in a stripe-like shape, sandwiched between the two lengths of the separation grooves;

side parts of the top face of a portion of the contact layer, facing the separation grooves, respectively, provided with tilted faces, respectively, such that the side parts of the top face undergo gradual decrease in thickness toward the separation grooves, respectively;

an insulating film covering portions extending from respective side faces of the ridge, facing the separation grooves, and including the separation grooves before running across the separation grooves to reach respective side edges of the semiconductor substrate, formed on the first face side of the semiconductor substrate:

a barrier metal layer made of metal (Au for an upper sub-layer, Pt for an intermediate sub-layer, Ti for a lower sub-layer) covering a portion of the contact layer, constituting the ridge, and the insulating film;

a first electrode (a p-electrode) made of Au, formed on top of the barrier metal layer; and a second electrode (an n-electrode) formed on the second face of the semiconductor substrate, wherein the first face of the semiconductor substrate is a crystal face tilted from the crystal face (001) of a GaAs crystal, and each of the tilted faces at the side parts of the top face of the portion of the contact layer, facing the separation grooves, respectively, is the crystal face (111) of the GaAs crystal.

A portion of the barrier metal layer, covering the portion of the contact layer, constituting the ridge, is preferably continuous with portions of the insulating film covering the respective side faces of the ridge, so that the surface of the portion of the contact layer, constituting the ridge, is not exposed from the barrier metal layer, and the insulating film.

Further, a buffer layer made up of a semiconductor layer (a GaAs layer) of the first conductivity type is preferably formed on the first face of the semiconductor substrate, and the first cladding layer is formed on top of the buffer layer.

Still further, the second cladding layer may comprise a first layer of a second cladding layer formed on the top face of the active layer, and a second layer of the second cladding layer formed underside of the contact layer while an etch-stop layer made up of a semiconductor layer of the second conductivity type, and formed of a constituent material lower in etching rate than the second layer of the second cladding layer, may be formed between the first layer of the second cladding layer, and the second layer of the second cladding layer, respective bottoms of the separation grooves being formed by the etch-stop layer.

The optical semiconductor device described as above is manufactured by the following manufacturing method.

The optical semiconductor device is manufactured by a manufacturing method according to the invention, comprising:

(a) the step of preparing a semiconductor substrate made up of a GaAs substrate of a first conductivity type (n-type), having a first face, and a second face, that is, a face on a side of the semiconductor substrate, opposite from the first face;

(b) the step of causing a first cladding layer made up of a semiconductor layer (an AlGaInP layer) of the first conductivity type, an active layer having a multiple quantum well structure comprising an AlGaInP layer serving as a barrier layer, and a GaInP layer serving as a well layer, a second cladding layer made up of a semiconductor layer (an AlGaInP layer) of a second conductivity type (p-type), and a contact layer made up of a semiconductor layer (a GaAs layer) of the second conductivity type to undergo epitaxial growth so as to be sequentially stacked over the first face of the semiconductor substrate;

(c) the step of forming a film and selectively etching the film to thereby form an etching mask for forming one length of a ridge in a stripe-like shape, and an etching mask for a field, positioned away from the etching mask for forming the ridge by a predetermined distance, on both sides thereof, over top of the contact layer;

(d) the step of applying anisotropic etching using wet etching to the contact layer, from the top face thereof to the underside thereof, with the use of both the etching mask for forming the ridge, and the etching masks for the fields, serving as masks, thereby forming a portion of the contact layer, corresponding to the ridge, etched edges thereof constituting tilted faces, respectively, underneath the etching mask for forming the ridge, and portions of the contact layer, corresponding to the fields, respectively, underneath the respective etching masks for the fields;

(e) the step of dry etching portions of the second cladding layer to a predetermined depth with the use of both the etching mask for forming the ridge, and the etching masks for the fields, together with the portion of the contact layer, corresponding to the ridge, and the portions of the contact layer, corresponding to the fields, respectively, serving as masks, to thereby form separation grooves, and the ridge in the shape of a rib-like stripe, surrounded by two lengths of the separation grooves;

(f) the step of applying wet etching after removal of both the etching mask for forming the ridge, and the etching masks for the fields, thereby rendering the ridge to have a width of a predetermined size;

(g) the step of forming an insulating film throughout the surface on the first face side of the semiconductor substrate;

(h) the step of removing a portion of the insulating film, on the top face of the ridge, on the semiconductor substrate;

(i) the step of forming a barrier metal layer made of a metal, throughout the surface on the first face side of the semiconductor substrate by vapor deposition;

(j) the step of forming an Au layer throughout the surface on the first face side of the semiconductor substrate by plating, thereby forming a first electrode; and (k) the step of forming a second electrode on the second face side of the semiconductor substrate.

Further, in the step (b), a first layer of the second cladding layer of the second conductivity type, an etch-stop layer made up of a GaInP layer of the second conductivity type, and a second layer of the second cladding layer of the second conductivity type may be formed so as to be sequentially stacked between the active layer and the contact layer, the etch-stop layer being formed of a constituent material lower in etching rate than the second layer of the second cladding layer while a buffer layer made up of a semiconductor layer (a GaAs layer) may be formed between the semiconductor substrate and the first cladding layer, and during etching in the steps (e) and (f), the second layer of the second cladding layer may be etched to a depth where the etch-stop layer is exposed out of the surface of the contact layer.

Still further, in the step (a), a GaAs substrate may be prepared so that the first face of the semiconductor substrate becomes a crystal face tilted from the crystal face (001), during the epitaxial growth in the step (b), the contact layer may be made up of a GaAs layer, and during the anisotropic etching using wet etching in the step (d), the portion of the contact layer, corresponding to the ridge, may be formed such that the tilted faces at the side parts of the top face of the portion of the contact layer, corresponding to the ridge, each become the crystal face (111) of a GaAs crystal.

(2) The invention provides an optical semiconductor comprising:
a package;
a plurality of leads extended inside and outside of the package;
an optical semiconductor device (a semiconductor laser device) attached to a sub-mount having conductivity, disposed inside the package;
connecting means for electrical connection between respective electrodes of the optical semiconductor device, and the leads, respectively; and
an optical system for guiding a laser beam emitted from an emitting face of the optical semiconductor device to the outside of the package,
said optical semiconductor device comprising:
a semiconductor substrate made up of a GaAs substrate of a first conductivity type, having a first face, and a second face that is a face on a side of the semiconductor substrate, opposite from the first face;
a first cladding layer made up of a semiconductor layer (an AlGaInP layer) of the first conductivity type, formed over the first face of the semiconductor substrate;
an active layer formed on top of the first cladding layer, having a multiple quantum well structure comprising an AlGaInP layer serving as a barrier layer, and a GaInP layer serving as a well layer;
a second cladding layer made up of a semiconductor layer (an AlGaInP layer) of a second conductivity type (p-type), formed on top of the active layer
a contact layer made up of a semiconductor layer (a GaAs layer) of the second conductivity type, formed over the second cladding layer;
two lengths of separation grooves each provided in such a way as to extend from the top face of the contact layer to reach an intermediate layer of the second cladding layer, thereby separating respective portions of the contact layer, and the second cladding layer, from each other;
a ridge in a stripe-like shape, sandwiched between the two lengths of the separation grooves;
side parts of the top face of a portion of the contact layer, facing the separation grooves, respectively, provided with tilted faces, respectively, such that the side parts of the top face undergo gradual decrease in thickness toward the separation grooves, respectively;
an insulating film covering portions extending from respective side faces of the ridge, facing the separation grooves, and including the separation grooves before running across the separation grooves to reach respective side edges of the semiconductor substrate, formed on the first face side of the semiconductor substrate:
a barrier metal layer made of metal (Au for an upper sub-layer, Pt for an intermediate sub-layer, Ti for a lower sub-layer) covering a portion of the contact layer, constituting the ridge, and the insulating film;
a first electrode (a p-electrode) made of Au, formed on top of the barrier metal layer; and
a second electrode (an n-electrode) formed on the second face of the semiconductor substrate, wherein the first face of the semiconductor substrate is a crystal face tilted from the crystal face (001) of a GaAs crystal, each of the tilted faces at the side parts of the top face of the portion of the contact layer, facing the separation grooves, respectively, is the crystal face (111) of the GaAs crystal, and the first electrode of said optical semiconductor device is connected to the sub-mount through the intermediary of a joining material.

Further, a buffer layer made up of a semiconductor layer (a GaAs layer) of the first conductivity type may be provided between the semiconductor substrate and the first cladding layer, a structure formed by sequentially stacking a first layer of the second cladding layer made up of a semiconductor layer of the second conductivity type, an etch-stop layer made up of a semiconductor layer (a GaInP layer) of the second conductivity type, and a second layer of the second cladding layer made up of a semiconductor layer of the second conductivity type may be provided between the active layer and the contact layer, and the separation grooves each separate respective portions of the contact layer, and the second layer of the second cladding layer, from each other, respective bottoms of the separation grooves being formed by the etch-stop layer.

Still further, with those features, the package preferably comprises a stem made up of a metal plate having a first face, and a second face, that is, a face on the opposite side of the first face, and a cap in a hat-like shape, fixed to the first face of the stem, in such a way as to cover the same, a hole is provided in the ceiling of the cap, opposed to the first face of the stem, the hole being closed with a transparent glass sheet to thereby form a window, the stem is provided with a plurality of leads constituting external electrode terminals, penetrating the stem from the first face to the second face thereof to be fixedly attached to the stem via an insulator, respectively, the stem is further provided with a lead constituting an external electrode terminal, electrically connected to the second face, and extended along the plurality of the leads, a heat sink made of a metal is fixedly attached to the first face of the stem, the sub-mount is fixedly attached to a side face of the heat sink, the first electrode of said optical semiconductor device is fixedly attached to the sub-mount through the intermediary of the joining material, the second electrode of said optical semiconductor device is connected to the lead electrically connected to the second face of the stem, the cap covers respective portions of the leads, the heat sink, said optical semiconductor device, and wires, positioned on the first face of the stem, and a laser beam emitted from an emitting face, that is, an end face of said optical semiconductor device is radiated to the outside of the package through the window.

Advantageous effects obtained by the representative embodiment of the invention, disclosed under the present application, are briefly described as follows.

(a) According to means described under item (1) as above, the respective side faces of the ridge are covered with the insulating film, the respective side faces of the portion of the contact layer, corresponding to the ridge, constituting the upper part of the ridge, are the tilted faces, and obtuse angles are formed at corners of the top face of the portion of the contact layer, corresponding to the ridge, on the respective sides thereof, so that the portion of the contact layer, corresponding to the ridge, on the top face side thereof, can be reliably covered with the barrier metal layer.

(b) In the formation of the ridge, after forming the portion of the contact layer, corresponding to the ridge, and the portions of the contact layer, corresponding to the fields by etching the contact layer, both side faces of the portion of the contact layer, corresponding to the ridge, are formed so as to become the tilted faces, respectively. Thereafter, etching is applied twice, including the dry etching and the wet etching each once, with the use of the portion of the contact layer, corresponding to the ridge, and the portions of the contact layer, corresponding to the fields, serving as the masks, to thereby form the separation grooves. As a result, a structure is formed such that the extremities of the portion of the contact layer, corresponding to the ridge, on the respective sides thereof, jut out toward the separation grooves, respectively; however, at least the undersides of the jutting out extremities of the portion of the contact layer, corresponding to the ridge, are covered with the insulating film. Further, the side faces of a portion of the second layer of the second cladding layer (the p-type cladding layer), forming a portion of the ridge, on the underside of the portion of the contact layer, corresponding to the ridge, are covered with portions of the insulating film 20, respectively, and the respective portions of the insulating film jut out further from the jutting out extremities of the portion of the contact layer, corresponding to the ridge, on the respective sides thereof, toward the respective separation grooves. As a result, a portion of the barrier metal layer 21 covering the portion of the contact layer, corresponding to the ridge, overlaps the portions of the insulating film 20 jutting out from the respective sides of the portion of the contact layer, corresponding to the ridge. Accordingly, the barrier metal layer and the insulating film, having such an advantageous effect as under (a) above, are linked with each other to thereby cover the portion of the contact layer, corresponding to the ridge, in such a way as to wrap the same up. Hence, the portion of the contact layer, corresponding to the ridge, is prevented from coming into contact with the first electrode (p-electrode) formed of Au, so that diffusion of Au into the portion of the contact layer, corresponding to the ridge, can be deterred, and an optical semiconductor device excellent in the characteristics thereof can be thereby manufactured.

(c) Because formation of a contact hole for electrically connecting the first electrode (p-electrode) to the portion of the contact layer, corresponding to the ridge, is executed by etching of the insulating film by use of a self-alignment process after the exposure and development of the contact-resist, it is possible to form the contact hole accurately above the ridge. It follows that the contact hole can be accurately formed even when the ridge is rendered further narrower.

(d) Because the formation of multi-layer growth layers on top of the semiconductor substrate is implemented by the MOCVD applied once, the number of the process steps is reduced, thereby enabling a production cost to be lowered.

(e) According to means described under item (2) as above, the semiconductor laser apparatus according to the invention is an optical semiconductor apparatus with the optical semiconductor device having a configuration described under items (1) as above, assembled inside the package, there is no risk that gold is diffused into the ridge of the optical semiconductor device to thereby cause degradation in the characteristics thereof, so that reliability of the optical semiconductor apparatus is enhanced.

BRIEF DESCRIPTION OF THE DRAWINGS

FIGS. 7A to 7G are schematic views showing the semiconductor substrate and so forth in respective steps of the manufacturing method for the semiconductor laser device according to the embodiment 1, from the step for growth of the multi-layer up to the step for application of a contact-resist;

FIGS. 8A to 8E are schematic views showing the semiconductor substrate and so forth in respective steps of the manufacturing method for the semiconductor laser device according to the embodiment 1, from the step for exposure development of the contact-resist up to up to the step for grinding of the substrate·formation of a second electrode;

FIGS. 13A to 13F are schematic views of the semiconductor substrate and so forth in the respective steps of a manufacturing method for the semiconductor laser device, as studied prior to development of the present invention, from the step for growth of a multi-layer up to the step for application of a contact-resist;

FIGS. 14A to 14E are schematic views showing the semiconductor substrate and so forth in the respective steps of the manufacturing method for the semiconductor laser device, as studied prior to development of the present invention, from the step for exposure·development of a contact-resist up to the step for grinding of a substrate formation of the second electrode.

DETAILED DESCRIPTION OF THE PREFERRED EMBODIMENTS

Figure 1:
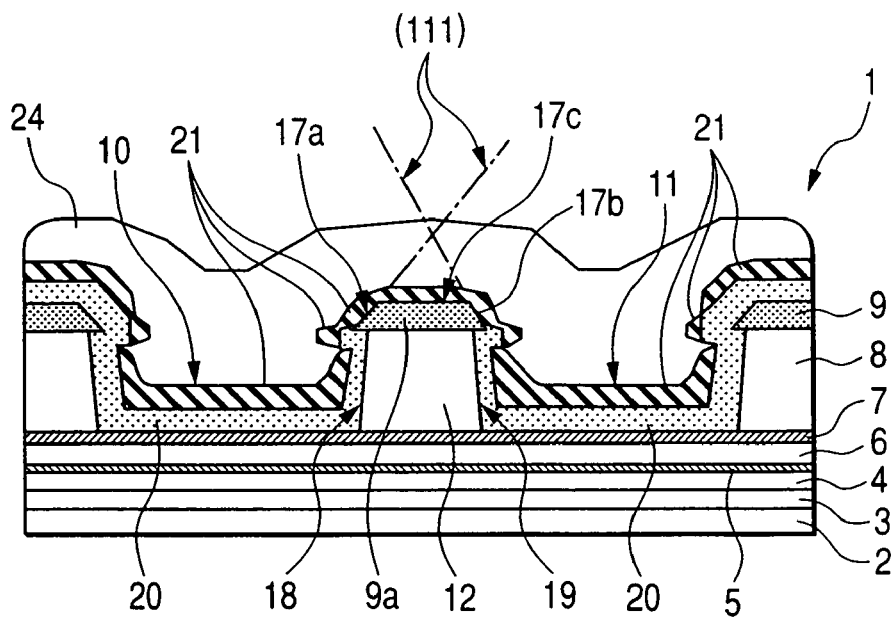
FIG. 1 is a schematic sectional view of a semiconductor laser device according to an embodiment 1 of the invention.

Embodiments of the invention are described in detail hereinafter with reference to the accompanying drawings. In all the figures for describing the embodiments of the invention, parts each having an identical function are denoted by like reference numerals, thereby omitting repeated description thereof.

Embodiment 1

Figure 4:
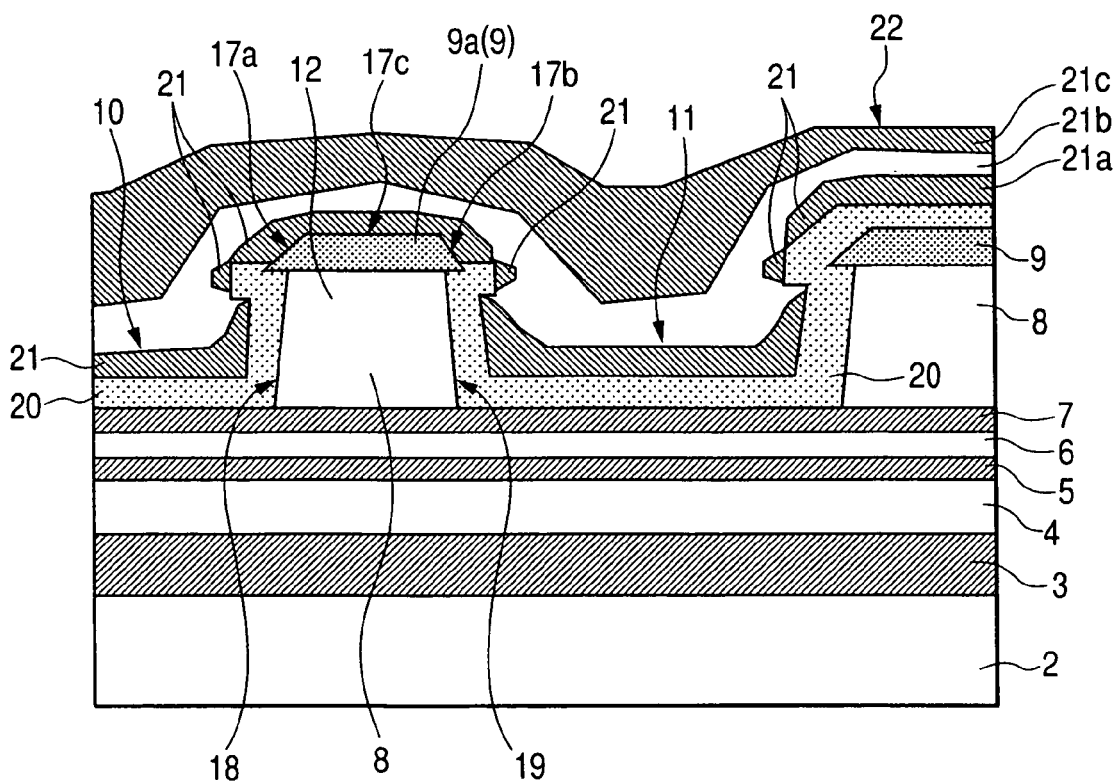
FIG. 4 is an enlarged sectional view showing a part of FIG. 3.
Figure 5:
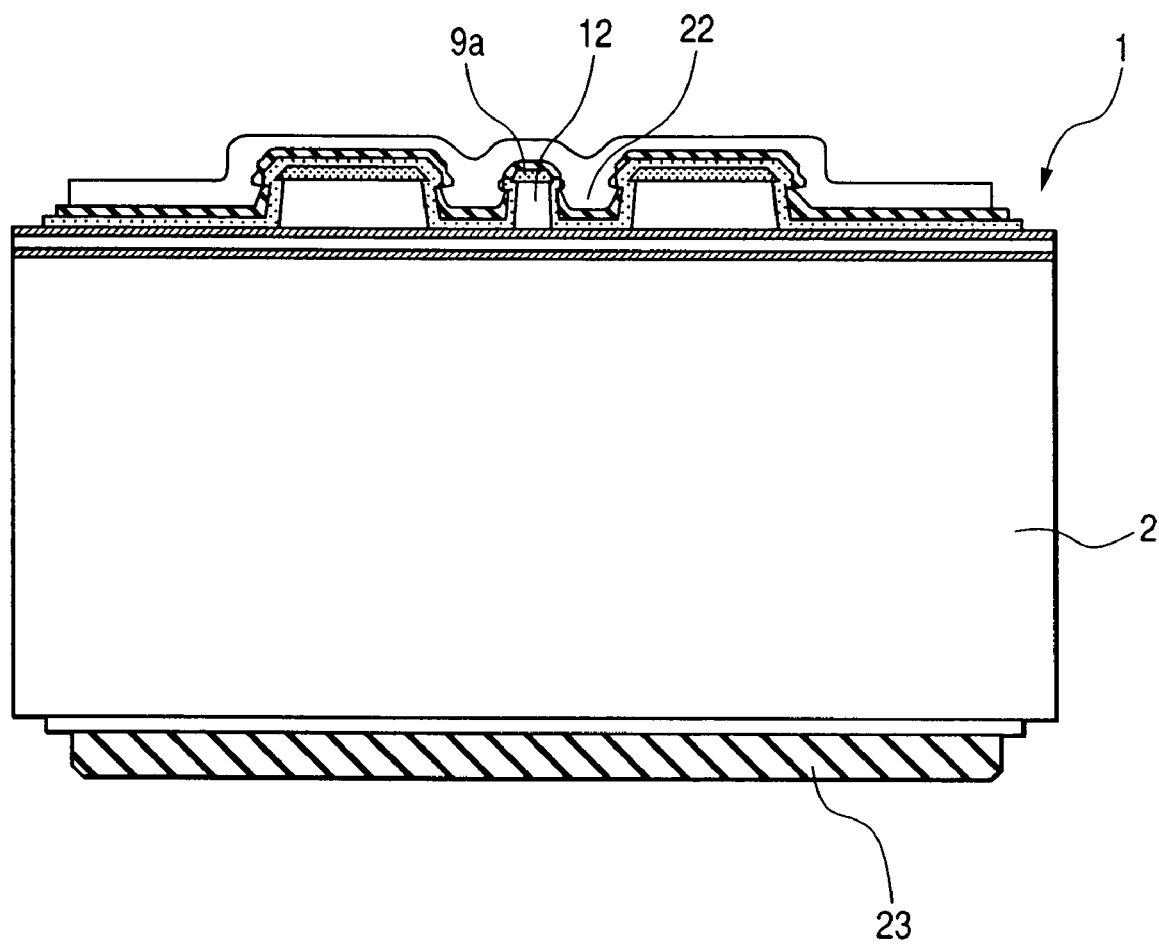
FIG. 5 is a schematic front view end of the semiconductor laser device according to the embodiment 1.
Figure 6:
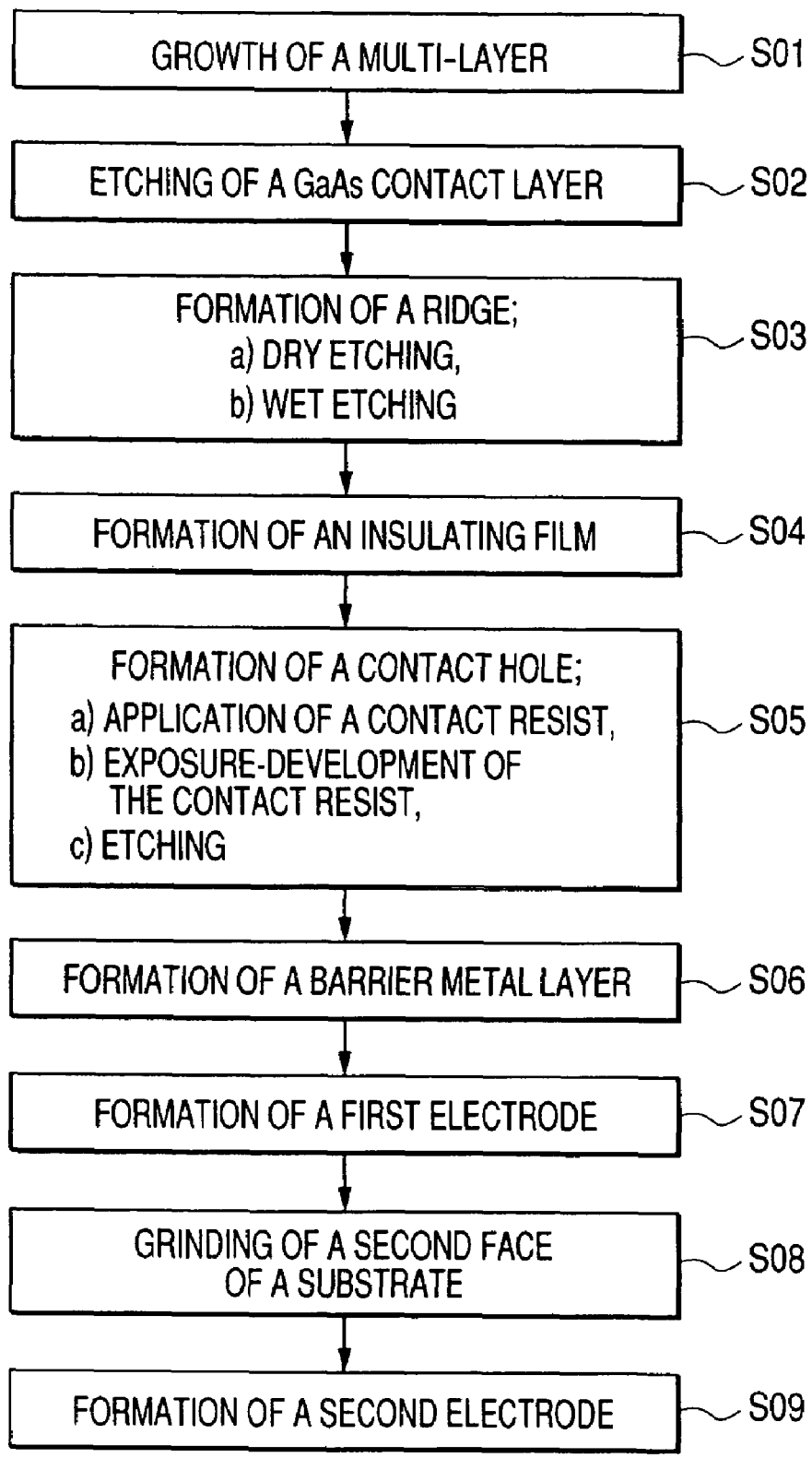
FIG. 6 is a flow chart showing a manufacturing method for the semiconductor laser device according to the embodiment 1.
Figure 9:
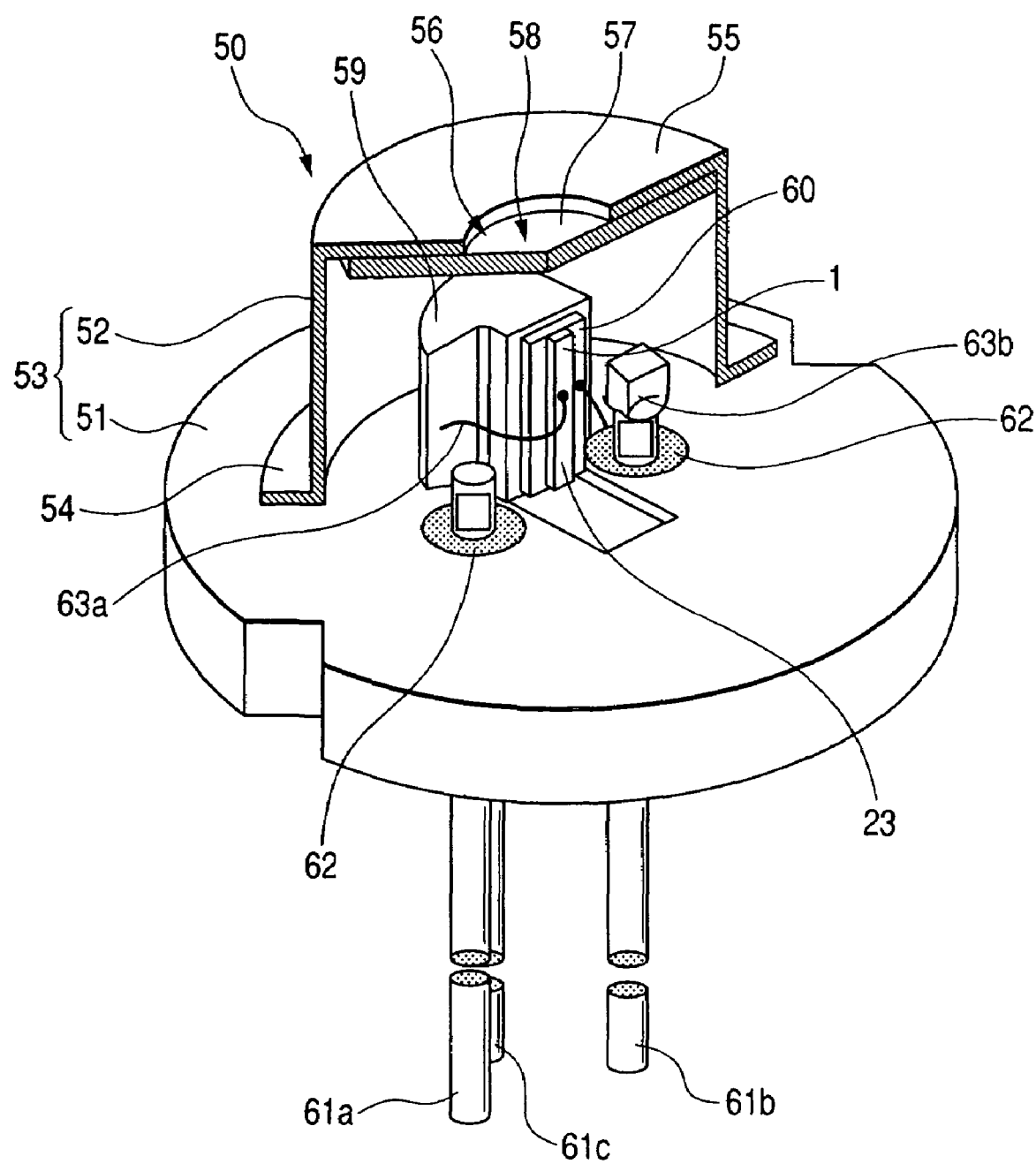
FIG. 9 is a partially cutaway perspective view of a semiconductor laser apparatus incorporating the semiconductor laser device according to the embodiment 1.
Figure 10:
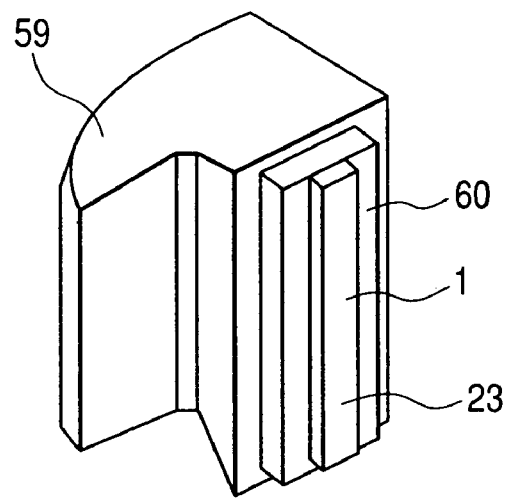
FIG. 10 is perspective view showing a heat sink, as a constituent member of the semiconductor laser apparatus and the semiconductor laser device fixedly attached to the heat sink with a sub-mount interposed therebetween.
Figure 11:
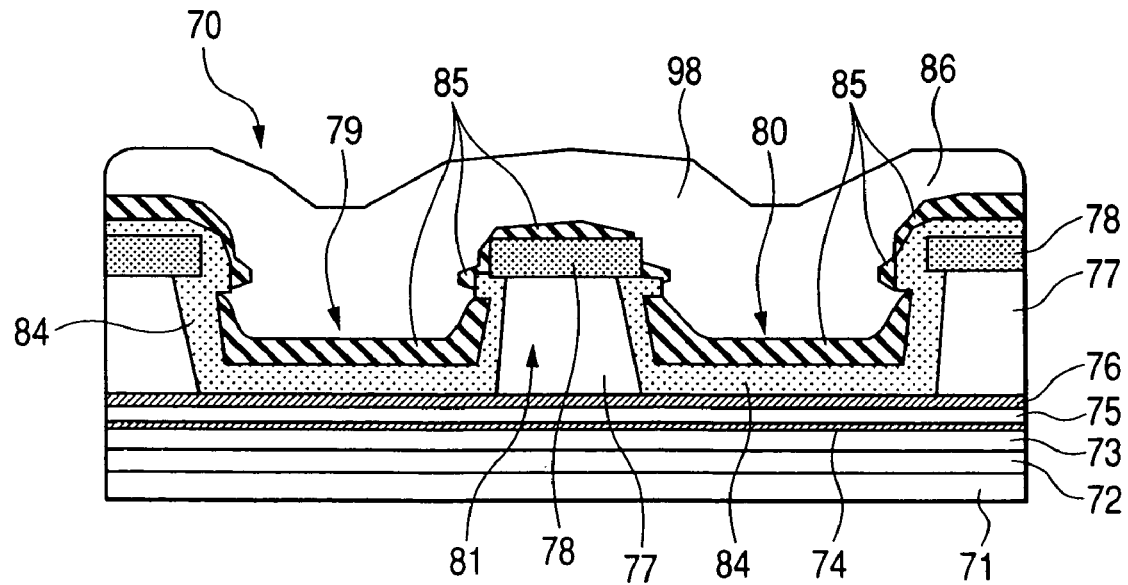
FIG. 11 is a partially sectional view showing the outline of a semiconductor laser device as studied prior to development of the present invention.
Figure 12:
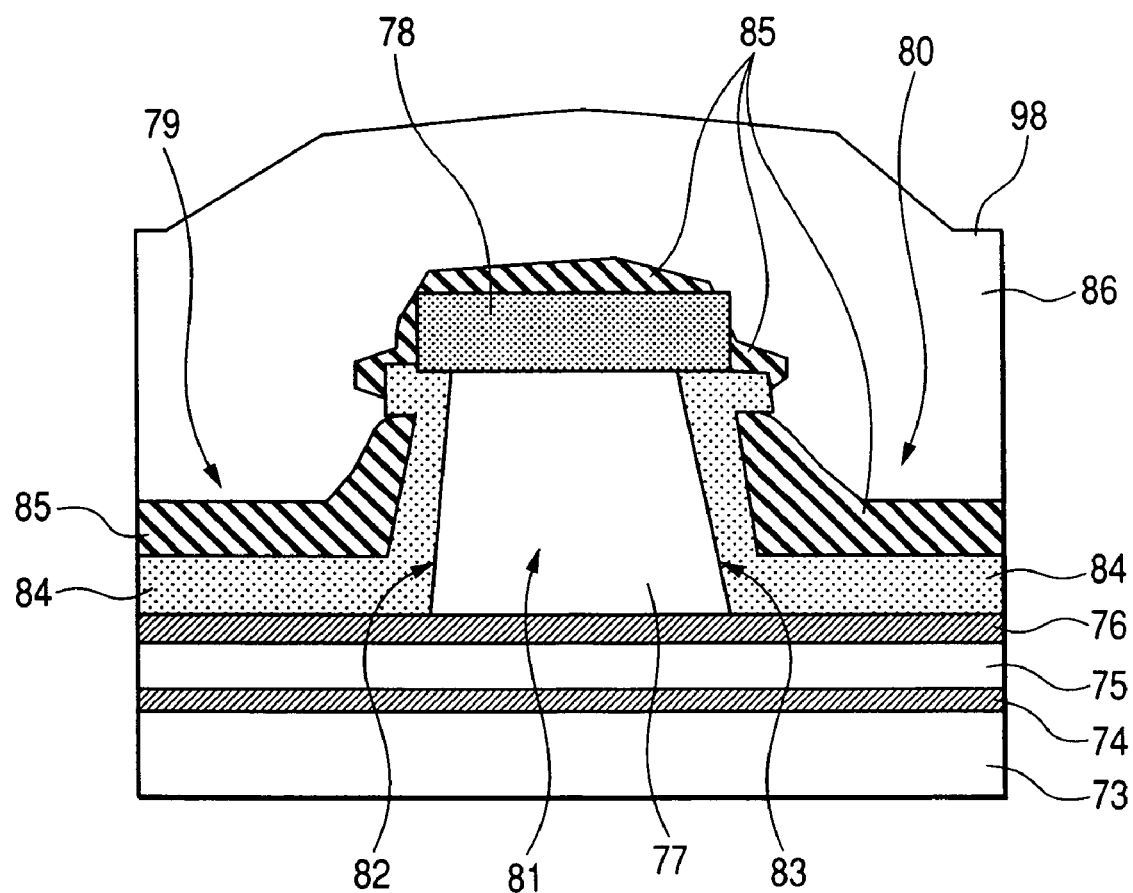
FIG. 12 is an enlarged sectional view showing a part of the semiconductor laser device shown in FIG. 11.
Figure 15:
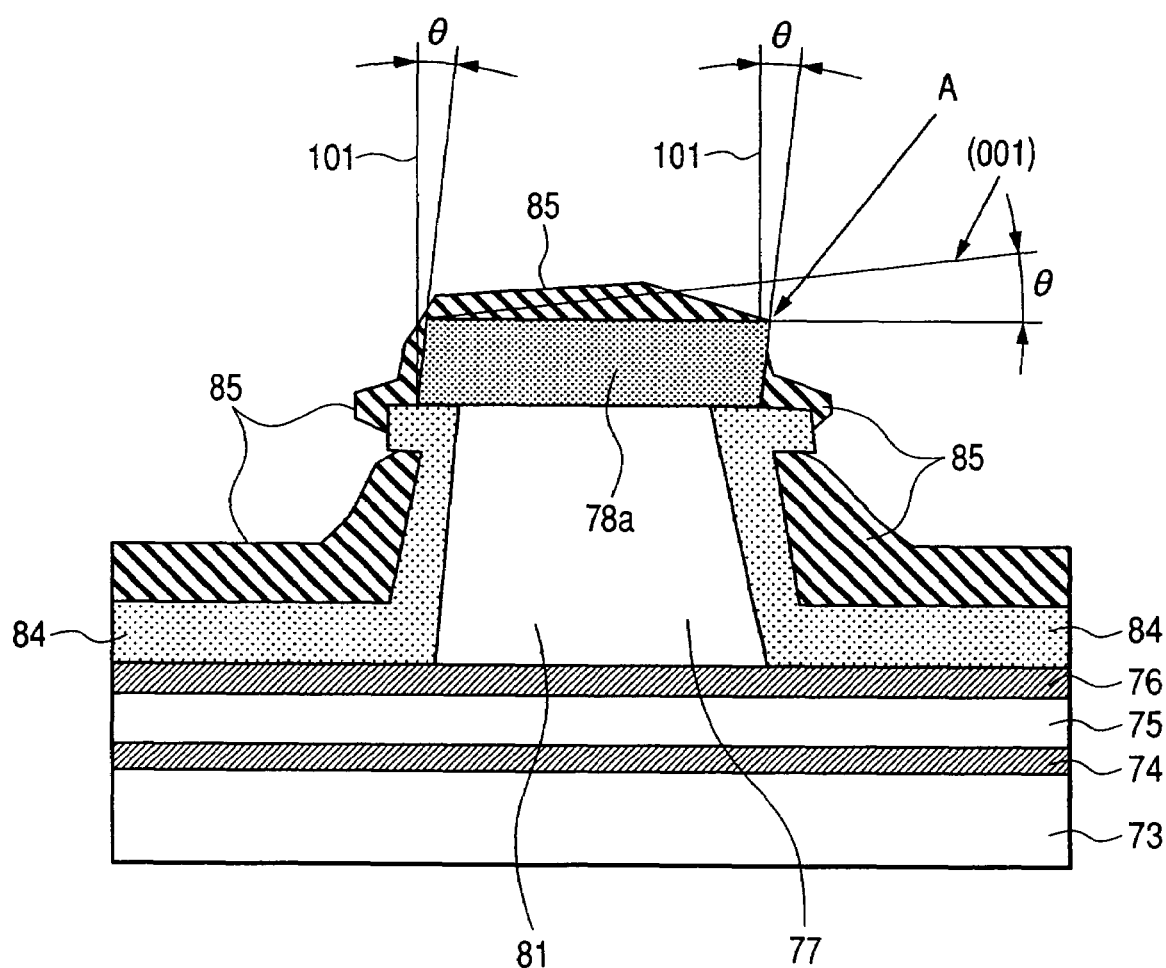
FIG. 15 is a schematic sectional view of a semiconductor substrate fabricated by the manufacturing method for the semiconductor laser device, as studied prior to development of the present invention, showing covering property of a barrier metal layer formed on top of a GaAs contact layer.

FIGS. 1 to 10 are views each concerning an embodiment 1 of an optical semiconductor device (a semiconductor laser device) according to the invention. FIGS. 1 to 5 are views each concerning a structure of the optical semiconductor device (semiconductor laser device), and FIGS. 6 to 8 are views each concerning a manufacturing method for the semiconductor laser device. Further, FIG. 9 is a partially cutaway perspective view of an optical semiconductor apparatus (a semiconductor laser apparatus) incorporating the optical semiconductor device according to the embodiment 1, and FIG. 10 is perspective view showing the optical semiconductor device fixedly attached to a heat sink, as a constituent member of the semiconductor laser apparatus, with a submount interposed therebetween.

With the embodiment 1, there is described a case where the present invention is applied to the manufacture of a red semiconductor laser (semiconductor laser device) in a wavelength band of 0.6 μm. Further, with the embodiment 1, there is described the case of a semiconductor laser device of an n-type (N-type) as a first conductivity type, and a p-type (P-type) as a second conductivity type, in a wavelength band of 650 nm.

FIG. 1 is a schematic sectional view of the optical semiconductor device (semiconductor laser device) according to the embodiment 1, so as to show the characteristics of the invention for the sake of greater clarity. FIGS. 2 to 5 are schematic views each concerning a semiconductor laser device 1 to be manufactured.

As shown in the schematic view of FIG. 1, the semiconductor laser device 1 has multi-layer growth layers made from compound semiconductors, disposed over a first face (the upper surface in FIG. 1) of a semiconductor substrate 2. The multi-layer growth layers have an n-type buffer layer 3, an n-type cladding layer 4 (a first cladding layer), an active layer 5, a p-type cladding layer (a first layer of a second cladding layer) 6, a p-type etch-stop layer 7, a p-type cladding layer (a second layer of the second cladding layer) 8, and a p-type contact layer 9, those layers being sequentially formed over a first face of a semiconductor substrate 2. The semiconductor substrate 2 is made up of a GaAs substrate a little less than 100 μm thick. The n-type buffer layer 3 is made up of a GaAs layer 0.5 μm thick, and the n-type cladding layer 4 (the first cladding layer) is made up of an AlGaInP layer 2.0 μm thick. The active layer 5 is of a multiple quantum well structure comprising a barrier layer made up of an AlGaInP layer 5 nm thick, and a well layer made up of a GaInP layer 6 nm thick, the well layer having three layers. The p-type cladding layer is made up by the p-type cladding layer (the first layer of the second cladding layer) 6 as a lower layer, and the p-type cladding layer (the second layer of the second cladding layer) 8 as an upper layer, and the p-type etch-stop layer 7 is formed between the p-type cladding layer 6, and the p-type cladding layer 8. The p-type cladding layer (the first layer of the second cladding layer) 6 is made up of an AlGaInP layer 0.3 μm thick, the p-type etch-stop layer 7 is made up of a GaInP layer 5 nm thick, and the p-type cladding layer (the second layer of the second cladding layer) 8 is made up of an AlGaInP layer 1.2 μm thick. Further, the p-type contact layer 9 is made up of a GaAs layer 0.4 μm thick.

As previously described, the first face of the semiconductor substrate 2, with the multi-layer growth layers formed thereon, is a crystal face tilted substantially by an angle θ from the crystal face (001) of a GaAs crystal. The angle θ being 10°, the first face of the semiconductor substrate 2 is <001> in crystal orientation.

The multi-layer growth layers are structured such that two lengths of separation grooves 10, 11 are formed on a side of the semiconductor substrate 2, adjacent to the first face, in such a way as to reach the underside face of the p-type cladding layer (the second layer of the second cladding layer) 8 from the upper surface of the p-type contact layer 9, and respective bottoms of the separation grooves 10, 11 are formed with the etch-stop layer 7. Portions of the multi-layer growth layers, sandwiched between the two lengths of the separation grooves 10, 11, constitute a ridge (rib) 12 in a stripe-like shape. The ridge 12 is on the order of 2 μm in width. The ridge 12 comprises a band-like (stripe-like) portion thereof, square in cross-section, made up of the p-type cladding layer (the second layer of the second cladding layer) 8, and a contact layer 9a of the ridge (a portion of the contact layer, corresponding to the ridge), rectangular in cross-section, made up of the p-type contact layer 9, overlying the band-like (stripe-like) portion thereof. Further, for the sake of convenience in description, parts of the multi-layer growth layers, spreading outside of the separation grooves 10, 11, respectively, are referred to as fields.

The ridge 12 is formed by the formation of the two lengths of the separation grooves 10, 11, through etching, and in the case of the embodiment 1, at the time of forming the separation grooves 10, 11 by etching the p-type cladding layer (the second layer of the second cladding layer) 8, such etching is executed twice. A first etching is dry etching using the contact layer 9a of the ridge as a mask to thereby define respective broad outline shapes of the separation grooves 10, 11. With the dry etching, corners of bottoms as etched cannot be satisfactorily etched, and portions of the p-type cladding layer 8, intended for removal, will remain, so that a second etching is executed by wet etching in order to implement etching of remaining portions of the p-type cladding layer 8, and to set the respective cross-sectional shapes of the separation grooves 10, 11, in good order.

Since portions of the p-type cladding layer (the second layer of the second cladding layer) 8 are formed by etching with the use of the contact layer 9a of the ridge as the mask, a portion of the ridge 12, formed of the p-type cladding layer (the second layer of the second cladding layer) 8, becomes narrower in width than the contact layer 9a of the ridge, so that the respective side faces of the portion of the ridge 12 are positioned on the inner sides of the extremities of the contact layer 9a of the ridge, on the respective sides thereof. In other words, the extremities of the contact layer 9a of the ridge, on the respective sides thereof, jut out from the portion of the ridge, formed of the p-type cladding layer (the second layer of the second cladding layer) 8, toward the separation grooves 10, 11, respectively.

The contact layer 9a of the ridge is formed by wet etching using an etching mask formed on top of the p-type contact layer 9, as a mask. In this case, because an anisotropic etching is executed, side faces of the contact layer 9a of the ridge, on the respective sides thereof, become tilted faces 17a, 17b, respectively. The tilted faces 17a, 17b become the GaAs crystal face (111). The tilted face 17a at one end of the contact layer 9a, on the left side in FIG. 1, is a tilted face rising rightward, and the tilted face 17b at the other end of the contact layer 9a of the ridge, on the right side in FIG. 1, is a tilted face falling rightward. Accordingly, an angle formed by either of the tilted faces 17a, 17b of the contact layer 9a of the ridge, and the top face thereof becomes an obtuse angle greater than 90°. The angle formed by the tilted face 17a, on the left side in FIG. 1, and the top face of the contact layer 9a of the ridge is on the order of 130°, and the angle formed by the tilted face 17b, on the right side in FIG. 1, and the top face of the same is on the order of 110°.

Meanwhile, there is provided an insulating film 20 covering portions of the multi-layer growth layers, on the first face side of the semiconductor substrate, extending from the respective side faces 18, 19 of the ridge 12, facing the separation grooves 10, 11, and including the separation grooves 10, 11, respectively, before running across the separation grooves 10, 11 to reach respective side edges of the semiconductor substrate. Further, a barrier metal layer 21 made of a metal is formed on the first face side of the semiconductor substrate. The barrier metal layer 21 covers the ridge 12, and the separation grooves 10, 11.

As shown in FIGS. 1 and 4, a portion of the contact layer 9a of the ridge, on the top face side thereof, is made up of a top face 17c, the tilted face 17a extending toward the left side of the top face 17c to be linked therewith, and the tilted face 17b extending toward the right side of the top face 17c to be linked therewith, and since the angles formed by the top face 17c, and the tilted faces 17a, 17b, respectively, become each the obtuse angle, the barrier metal layer 21 covering the portion of the contact layer 9a of the ridge, on the top face side thereof, is not cut off on corners that are junctions between the top face 17c, and the tilted faces 17a, 17b, respectively.

Further, as is evident from the method for manufacturing the semiconductor laser device, to be described later on, there will be formed a structure wherein the extremities of the contact layer 9a of the ridge, on the respective sides thereof, overlie portions of the insulating film 20, covering the respective side faces of the portion of the p-type cladding layer (the second layer of the second cladding layer) 8, forming the ridge 12. Portions of the barrier metal layer 21, covering the contact layer 9a of the ridge, is in close contact with the top faces of the respective portions of the insulating film 20, structured in such a way as to support the contact layer 9a of the ridge, thereby rendering the barrier metal layer 21 continuous with the insulating film 20. Consequently, a structure is formed such that the barrier metal layer 21 and the insulating film 20 embraceably cover the ridge 12 including the contact layer 9a of the ridge.

Meanwhile, an Au plating layer 24 is formed so as to overlie the barrier metal layer 21. A first electrode (p-electrode) 22 is formed with the barrier metal layer 21, and the Au plating layer 24. Further, as shown in FIG. 2, a second electrode (an n-electrode) 23 is provided on a second face of the semiconductor substrate 2, that is, a face on a side thereof, opposite from the first face.

With the semiconductor laser device 1 described as above, by applying a predetermined voltage to the first electrode (the p-electrode) 22, and the second electrode (the n-electrode) 23, respectively, a laser beam is emitted from respective end faces of the semiconductor laser device 1, in a direction orthogonal to a direction in which the ridge 12 is extended. Flow of an electric current causes a portion of the active layer, in a stripe-like shape, facing the ridge 12, to act as an optical waveguide (resonator), and an emitting face for emitting the laser beam is formed at the respective ends of the optical waveguide.

Figure 2:
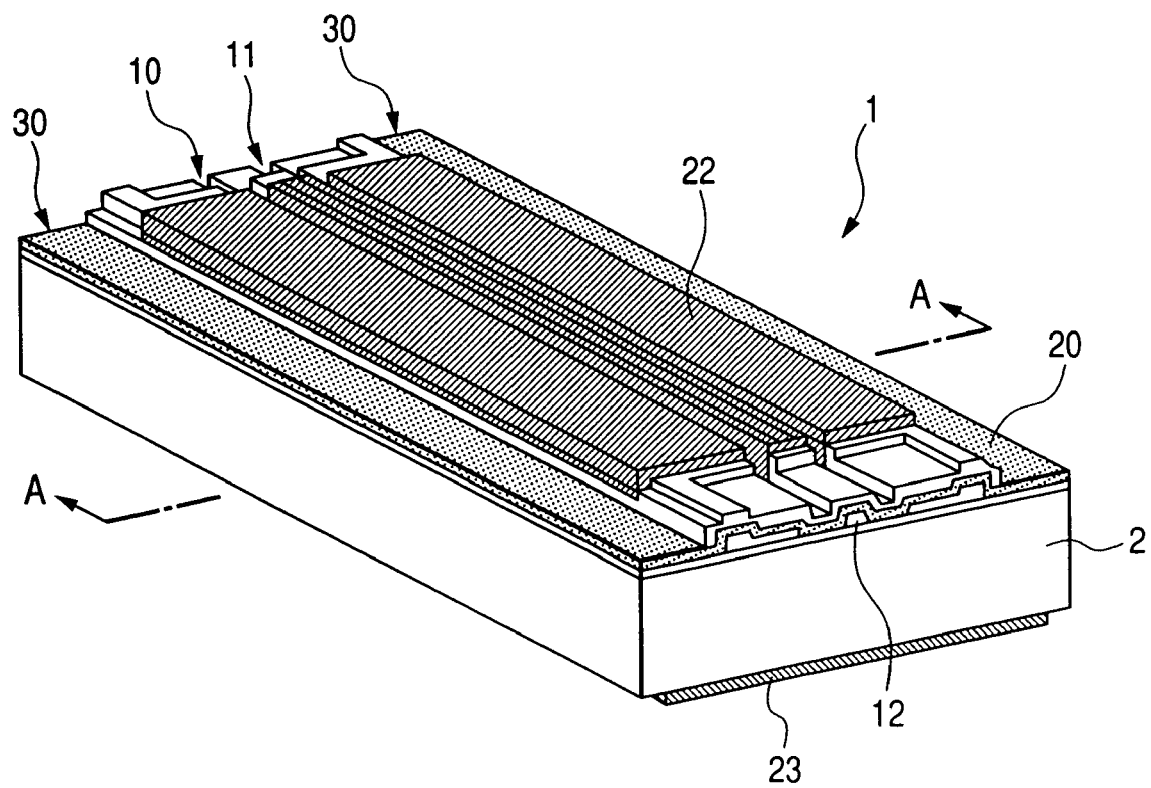
FIG. 2 is a perspective view of the semiconductor laser device 1 according to the embodiment 1.
Figure 3:
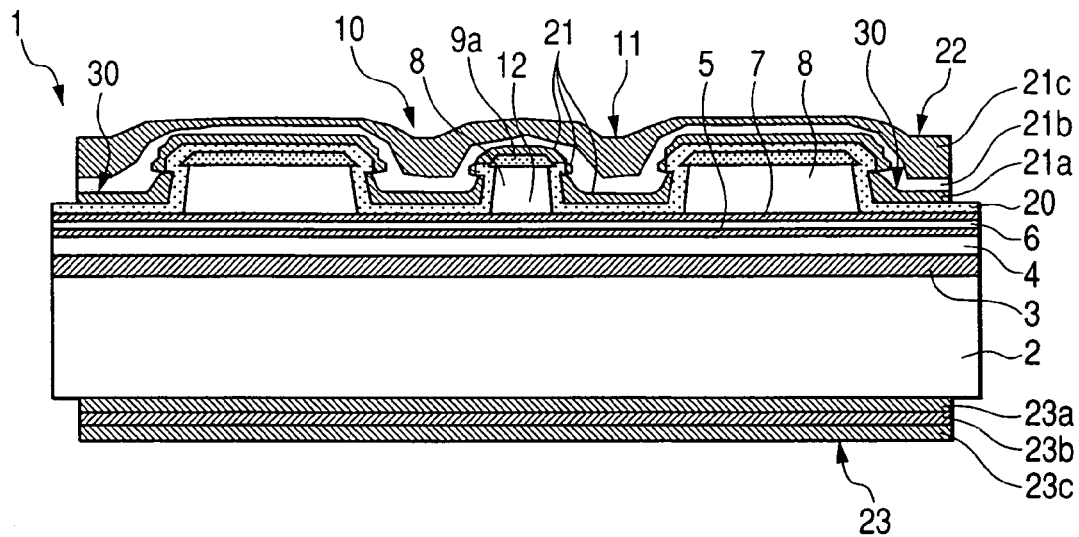
FIG. 3 is an enlarged sectional view taken on line A -A in FIG. 2.

FIG. 2 is a perspective view showing the semiconductor laser device 1 to be actually manufactured. FIG. 3 is a sectional view taken on line A-A in FIG. 2, and FIG. 4 is an enlarged sectional view showing the ridge 12 in FIG. 3 for greater clarity. FIG. 5 is an end view of the semiconductor laser device 1 emphatically showing that side faces of the semiconductor laser device 1 are tilted by the angle θ when semiconductor laser chips are manufactured by cleaving the semiconductor substrates because the semiconductor laser device 1 according to the embodiment 1 is manufactured with the use of the semiconductor substrate, the first face of which is the crystal face tilted by the angle θ (10°) from the crystal face (001) of the GaAs crystal.

With the semiconductor laser device 1 shown in FIG. 2, the insulating film 20 indicated by pin dots put thereon is provided across the entire region on the first face side of the semiconductor substrate 2. Further, with the semiconductor laser device 1 shown in FIG. 2, the first electrode (p-electrode) 22 on the top face thereof, indicated by hatching, is shown to be a metal layer formed by the vapor deposition applied at the time of forming the barrier metal layer. As shown in FIGS. 2 and 3, the metal layer is made up of, for example, a Ti layer 21a 0.05 μm thick, constituting the lowermost layer, a Pt layer 21b 0.1 μm thick, formed on top of the Ti layer 21a, and an Au layer 21c 0.3 μm thick, formed on top of the Pt layer 21b. The angles formed by the top face 17c of the contact layer 9a of the ridge, and the tilted faces 17a, 17b, respectively, are obtuse angles as large as 130°, and 110°, respectively, so that the Ti layer 21a covering the portion of the contact layer 9a of the ridge, on the top face side thereof, can completely cover the contact layer 9a of the ridge. In FIGS. 2 and 3, the Ti layer 21a, the Pt layer 21b, and the Au layer 21c are together called as the first electrode (p-electrode) 22.

With the semiconductor laser device 1 shown in FIG. 1, since the Au plating is applied after the vapor deposition for the formation of the barrier metal layer, the Au layer 21c becomes integral with the Au plating layer 24, so that the uppermost layer of the first electrode (p-electrode) 22 is denoted as the Au plating layer 24 in FIG. 1.

Further, as shown in FIG. 2, a structure is adopted such that the first electrode (p-electrode) 22 is not to be provided for a predetermined length over respective end portions of the resonator so that electric current more than necessary is not supplied to the respective end portions thereof. The reason for this is to prevent occurrence of optical degradation at the respective ends of the resonator, due to an increase in current density at the respective ends thereof.

With the semiconductor laser device 1, the second electrode (an n-electrode) 23 has a multi-layered structure as shown in FIG. 3. More specifically, the second electrode (an n-electrode) 23 is made up of an AuGeNi layer 23a 0.2 μm thick, formed on the second face of the semiconductor substrate 2, a Cr layer 23b 0.2 μm thick, formed so as to overlie the AuGeNi layer 23a, and an Au layer 23c 1.0 μm thick, formed so as to overlie the Cr layer 23b.

As shown in FIG. 4, the Ti layer 21a, together with the insulating film 20, completely covers the contact layer 9a of the ridge. Further, in the figure, the Pt layer 21b is shown to be in an excellent state covering the entire upper face of the ridge 12 without causing stepping. Accordingly, there occurs no contact between Au and the contact layer 9a of the ridge, so that Au is prevented from being diffused into the contact layer 9a of the ridge, thereby eliminating the risk of occurrence of degradation in the characteristics of the semiconductor laser device 1.

The semiconductor laser device 1, shown in FIGS. 2 and 3, may have a structure wherein grooves 30 running along the separation grooves 10, 11, respectively, are provided on side edges of the semiconductor substrate 2, on the first face side thereof, respectively, so as to be extended from one end (an end face in the lower right part of FIG. 2) of the semiconductor substrate 2 to the other end (an end face in the upper left part of FIG. 2) thereof.

With the structure described as above, the grooves 30 are provided down to a depth (to an intermediate layer of the second cladding layer) where the p-type etch-stop layer 7 is exposed. The grooves 30 as well are partially covered with the insulating film 20, and the barrier metal layer 21. With the structure described, the first electrode (p-electrode) 22 can be rendered narrower in width than semiconductor laser device With the embodiment 1, the n-type buffer layer 3 is provided; however, the invention can be applied to a structure without the n-type buffer layer 3 provided. Further, there is adopted a structure wherein the p-type cladding layer (the first layer of the second cladding layer) 6, p-type etch-stop layer 7, and p-type cladding layer (the second layer of the second cladding layer) 8 are formed between the active layer 5, and the p-type contact layer 9, and the separation grooves 10, 11 are formed such that the etch-stop layer 7 appear at the respective bottoms of the separation grooves 10, 11; however, the invention can be similarly applied to a structure wherein a p-type second cladding layer is provided between the active layer 5, and the p-type contact layer 9, and the separation grooves 10, 11 are provided so as to reach an intermediate layer part of the p-type second cladding layer.

Now, the manufacturing method for the semiconductor laser device 1 shown in FIG. 1 is described hereinafter with reference to FIGS. 6 to 8. As shown in a flow chart of FIG. 6, the semiconductor laser device 1 according to the embodiment 1 is manufactured by taking respective steps for growth of the multi-layer (S01), etching of the GaAs contact layer (S02), formation of the ridge (S03), formation of the insulating film (S04), formation of a contact hole (S05), formation of the barrier metal layer (S06), formation of the first electrode (S07), grinding of the second face of the substrate (S08) and formation of the second electrode (S09).

Further, FIGS. 7A to 7G are schematic views showing the semiconductor substrate and so forth in respective steps for growth of the multi-layer, formation of a mask for the ridge by CVD, etching of the GaAs contact layer, formation of the ridge (dry etching), formation of the ridge (wet etching), formation of the insulating film, and application of a contact-resist. FIGS. 8A to 8E are schematic views showing the semiconductor substrate and so forth in respective steps of exposure·development of the contact-resist, formation of the contact hole (dry etching of the CVD film), formation of the barrier metal layer, formation of the first electrode, and grinding of a substrate·formation of the second electrode.

FIGS. 7A to 7G, and FIGS. 8A to 8E are schematic sectional views showing the respective steps shown in the flow chart of FIG. 6 after subdividing those steps for the sake of clarity.

Prepared first is the semiconductor substrate 2 made of GaAs of the first conductivity type (the n-type), having the first face, and the second face, that is, a face on the side of the semiconductor substrate 2, opposite from the first face. The first face of the semiconductor substrate 2, with the multi-layer growth layers formed thereon, is the crystal face tilted substantially by the angle θ (10°) from the crystal face (001) of the GaAs crystal. The first face of the semiconductor substrate 2 is <001> in crystal orientation.

In the step for growth of the multi-layer, shown in FIG. 7A, the n-type buffer layer 3, n-type cladding layer 4 (the first cladding layer), active layer 5, p-type cladding layer (the first layer of the second cladding layer) 6, p-type etch-stop layer 7, p-type cladding layer (the second layer of the second cladding layer) 8, and contact layer 9 are formed to the respective predetermined thicknesses over the first face of the semiconductor substrate 2 made of the n-type GaAs by processing applied at a time, using the MOCVD (the organometallic chemical vapor deposition method). Since the multi-layer growth layers are formed by the processing applied at a time, using the MOCVD, it is possible to reduce the cost of manufacturing the semiconductor laser device 1. To give an example, the n-type buffer layer 3 is 0.5 μm thick, the n-type cladding layer 4 is 2.0 μm thick, the active layer 5 is 0.04 μm thick, the p-type cladding layer (the first layer of the second cladding layer) 6 is 0.3 μm thick, the p-type etch-stop layer 7 is 5 nm thick, the p-type cladding layer (the second layer of the second cladding layer) 8 is 1.2 μm thick, and the p-type contact layer 9 is 0.4 μm thick.

Subsequently, in the step for formation of a mask for the ridge by CVD, shown in FIG. 7B, an SiO$_2$ film, for example, 400 nm thick is formed on the top face of the contact layer 9 by a CVD method. Thereafter, the SiO$_2$ film is patterned by the usual photolithographic techniques and etching techniques to thereby form an etching mask 41 for forming the ridge in a stripe-like (band-like) shape in order to form the ridge 12, and etching masks 42 for fields, away from the etching mask 41 by a predetermined distance, respectively..

Subsequently, in the step for etching of the GaAs contact layer, as shown in FIG. 7C, portions of the contact layer 9, for forming the separation grooves 10, 11, are removed by anisotropic etching using wet etching with the use of the etching mask 41 for forming the ridge, and the etching masks 42 for fields, serving as masks.

As a result of such etching as described, there are formed the contact layer 9a of the ridge, underneath the etching mask 41 for forming the ridge, and contact layers 9b of the fields (portions of the contact layer, corresponding to the fields, respectively), underneath the etching masks 42 for fields, respectively.

For an etchant, use is made of POG (an etchant composed of phosphoric acid, aqueous hydrogen peroxide, and ethylene glycol) showing anisotropic etching property against a GaAs crystal. The first face of the semiconductor substrate 2 is the crystal face tilted substantially by the angle θ from the crystal face (001) of the GaAs crystal. Accordingly, the p-type contact layer 9 made up of the GaAs layer has the same crystallinity. By the agency of the etchant moving around underside of the etching mask 41 for forming the ridge in the course of the anisotropic etching, side faces of the contact layer 9a of the ridge are turned into the tilted faces 17a, 17b, respectively. The tilted faces 17a, 17b each are the crystal face (111) of the GaAs crystal. The tilted face 17a at the end of the contact layer 9a, on the left side in FIG. 7C, is the tilted face rising rightward, and the tilted face 17b at the other end of the contact layer 9a, on the right side in FIG. 7C, is the tilted face falling rightward. Accordingly, the angle formed by either of the tilted faces 17a, 17b of the contact layer 9a of the ridge, and the top face thereof becomes the obtuse angle greater than 90°. The angle formed by the tilted face 17a, on the left side in FIG. 7C, and the top face of the contact layer 9a of the ridge is on the order of 130°, and the angle formed by the tilted face 17b, on the right side in FIG. 7C, and the top face of the same is on the order of 110°. A similar tilted face emerges at an etched end of each of the contact layers 9b of the fields, underneath the respective etching masks 42 for fields. The arrows in the figure indicate an etching direction.

Subsequently, in the step for formation of the ridge by dry etching, as shown in FIG. 7D, portions of the p-type cladding layer (the second layer of the second cladding layer) 8 are further etched with the use of the contact layer 9a of the ridge, and the contact layers 9b of the fields, serving as masks, to thereby render the separation grooves 10, 11 deeper until the p-type etch-stop layer 7 is exposed at the respective bottom faces thereof. The p-type cladding layer (the second layer of the second cladding layer) 8, and the p-type contact layer 9 are divided by the separation grooves 10, 11, respectively. Portions of the multi-layer growth layers, sandwiched between the two lengths of the separation grooves 10, 11, constitute the ridge 12 in a band-like (stripe-like) shape. The ridge 12 has a width a, for example, 2 μm. Further, the separation grooves 10, 11 each has a width d 10 μm. The etching mask 41 for forming the ridge has a width c, for example, 2 μm.

As shown in FIG. 7E, because the bottom corners of the separation grooves 79, 80, respectively, are insufficiently etched by the dry etching, wet etching using a HF based, or HCl based etchant is applied, thereby forming the ridge 12 square in sectional shape. In this case, the wet etching is applied after removal of the etching mask 41 for forming the ridge, and the etching masks 42 for fields. As a result of the etching applied twice, the extremities of the contact layer 9a of the ridge, as etched, on the respective sides thereof, jut out from (overhang) the ridge 12.

Subsequently, as shown in FIG. 7F, the insulating film 20 is formed by the CVD method in such a way as to cover the ridge 12, the separation grooves 10, 11, and so forth. The insulating film 20 is made up of an $SiO_2$ film, for example, 200 nm thick. The insulating protection film made up of the $SiO_2$ film can cover vertical parts and overhanging parts of a structure with reliability.

Subsequently, as shown in FIG. 7G, a contact-resist 43 for forming a contact hole to make connection between the contact layer 9a of the ridge, constituting the upper part of the ridge 12, and the electrode, is applied in such way as to cover the entire surface including the ridge 12, the separation grooves 10, 11, and so forth.

Then, as shown in FIG. 8A, there is formed a photo mask 45 having an opening 44 such that the ridge 12 is positioned therein by the usual photolithographic techniques and etching techniques. Then, exposure·development of the contact-resist 43 is executed with the use of the photo mask 45 as a mask. By so doing, a portion of the contact-resist 43, on top of the ridge 12, is removed to thereby expose a portion of the insulating film 20, on top of the contact layer 9a of the ridge. Further, the photo mask 45 is formed such that the opening 44 has a width m on the order of 12 μm, to thereby expose even portions of the insulating film 20, covering the respective side portions of the contact layer 9a of the ridge. In this connection, in FIG. 8A, the photo mask 45 is shown as-floated state in regions of the separation grooves 10, 11, respectively, for the sake of clarity; however, in an actual structure, the photo mask 45 is in close contact with the contact-resist 43.

Then, the photo mask 45 is removed, and subsequently, a portion of the insulating film 20, exposed over the ridge 12, is removed by dry etching in the step of forming the contact hole. By so doing, the contact layer 9a of the ridge is exposed (refer to FIG. 8B).

Subsequently, as shown in FIG. 8C, the barrier metal layer 21 is formed by vapor deposition in such a way as to cover the ridge 12, the separation grooves 10, 11, and so forth. This step is taken to prevent degradation in the characteristics of a semiconductor laser from occurring because the first electrode (p-electrode) 22 is made of Au, and the Au otherwise undergoes diffusion into the contact layer 9a of the ridge. To take an example, with the vapor deposition, respective layers of Ti, Pt, and Au are vapor-deposited in that order. The Pt layer and Ti layer each act as a barrier for blocking contact between the contact layer 9a of the ridge, and the Au. Further, as gold plating is applied in a back-end step, a thin Au layer is provided in the uppermost layer. The Ti layer is 0.05 μm thick, the Pt layer is 0.1 μm thick, and the Au layer is 0.3 μm thick. Metals used as barriers, and combination thereof are not to be limited to the present embodiment.

In the formation of the barrier metal layer, the respective side faces of the ridge 12 are already covered with the insulating film 20, the respective side faces of the contact layer 9a of the ridge, constituting the upper part of the ridge 12, are the tilted faces 17a, 17b, and the angles formed by the top face 17c of the contact layer 9a of the ridge, and the tilted faces 17a, 17b, respectively, become obtuse angles, so that the portion of the contact layer 9a of the ridge, on the top face side thereof, can be reliably covered with the barrier metal layer 21.

Further, in the formation of the ridge, after forming the contact layer 9a of the ridge, and the contact layers 9b of the fields by etching the p-type contact layer 9, both the side faces of the contact layer 9a of the ridge are formed so as to become the tilted faces 17a, 17b, respectively. Thereafter, etching is applied twice, including the dry etching and the wet etching each once, with the use of the contact layer 9a of the ridge, and the contact layers 9b of the fields, serving as the masks, to thereby form the separation grooves 10, 11. As a result, a structure is formed such that the extremities of the contact layer 9a of the ridge, on the respective sides thereof, jut out into the separation grooves 10, 11, respectively; however, at least the undersides of the jutting out extremities of the contact layer 9a of the ridge are covered with the insulating film 20. Further, the side faces of a portion of the p-type cladding layer (the second layer of the second cladding layer) 8, forming a portion of the ridge, on the underside of the contact layer 9a of the ridge, are covered with portions of the insulating film 20, respectively, and the respective portions of the insulating film 20 jut out further from the jutting out extremities of the contact layer 9a of the ridge, on the respective sides thereof, toward the respective separation grooves 10, 11. As a result, a portion of the barrier metal layer 21 covering the contact layer 9a of the ridge overlaps the portions of the insulating film 20 jutting out from the respective sides of the contact layer 9a of the ridge. Accordingly, the portion of the barrier metal layer 21, facing the contact layer 9a of the ridge, is linked with the respective portions of the insulating film 20 to thereby cover the contact layer 9a of the ridge in such a way as to wrap the same up. Hence, the contact layer 9a of the ridge is prevented from coming into contact with the first electrode (p-electrode) 22 formed of Au, so that diffusion of Au into the contact layer 9a of the ridge can be deterred.

Subsequently, as shown in FIG. 8D, the Au plating is applied to the barrier metal layer 21 to thereby form the Au plating layer on top of the barrier metal layer 21. The Au plating layer constitutes the first electrode (p-electrode) 22. The Au plating layer is formed to have a large thickness in order to effectively dissipate heat generated in the semiconductor laser device. The Au plating layer is formed to a thickness of, for example, 3.5 μm.

The, as shown in FIG. 8E, the second face of the semiconductor substrate 2 is ground by a predetermined thickness, so that the semiconductor substrate 2 is formed to have a predetermined thickness. Thereafter, a substrate electrode 47 is formed over the second face of the semiconductor substrate 2 by vapor deposition. The substrate electrode 47 is of a multilayered structure formed by sequentially stacking, for example, an AuGeNi layer, a Cr layer, and an Au layer. Subsequently, an Au plating layer is formed on top of the substrate electrode 47 by applying Au plating thereto to thereby form the second electrode (the n-electrode) 23. The Au plating layer is formed to a thickness of, for example, 3.5 μm. In FIG. 3, the Au plating layer is omitted.

Thus, the semiconductor laser device 1 is manufactured. In practical manufacturing of the same, use is made of a semiconductor substrate wide in area, called a wafer, and a plurality of the semiconductor substrates, each in such a sectional construction as shown in FIG. 8E, are formed in parallel. Thereafter, the wafer is divided at predetermined intervals in a direction along the ridge 12 to thereby form strip-like pieces thereof. Further, the strip-like pieces are cleaved at predetermined intervals, thereby manufacturing a plurality of the semiconductor substrates 2.

The semiconductor laser device (optical semiconductor device) 1 as described in the foregoing is assembled in a package (sealed container) to be used in the form of a semiconductor laser apparatus (an optical semiconductor apparatus). FIG. 9 shows the optical semiconductor apparatus (semiconductor laser apparatus) 50 with the semiconductor laser device 1 assembled therein by way of example.

The semiconductor laser apparatus 50 comprises a stem 51 several mm thick, made up of a metal plate (disk) having a first face, and a second face, that is, a face on the opposite side of the first face, and a cap 52 in a hat-like shape, fixed to the first face (the top face in FIG. 9) in such a way as to cover the same. A package 53 is formed by the stem 51, and the cap 52. The cap 52 has a flange 54 provided at a lower part thereof, and the underside of flange 54 is connected to the stem 51 with a joining material (not shown). A hole 56 is provided in the ceiling 55 of the cap 52, and the hole 56 is closed with a transparent glass sheet 57, to thereby form a window 58. A laser beam is emitted from the window 58 to the outside of the package 53. The ceiling 55 is opposed to the first face of the stem 51.

A heat sink 59 is fixedly attached to a portion of the first face of the stem 51, off the center thereof, with an electrically conductive brazing material, and so forth. The sub-mount 60 made of AlN (aluminum nitride), excellent in heat conductivity and having electrical conductivity, is fixedly attached to the top side of a side face of the heat sink 59, facing the center of the stem 51 (refer to FIG. 10). The sub-mount 60 is made up of a rectangular sheet larger in size than the semiconductor laser device 1. Since the semiconductor laser device 1 is slender in shape and a laser beam is emitted from the respective ends thereof, the sub-mount 60 that is slender is fixedly attached to the heat sink 59 so as to be oriented in the vertical direction to the stem 51. Consequently, the semiconductor laser apparatus 50 has a structure such that the emitting face of the semiconductor laser device 1 is opposed to the window 58. Further, the surface of the sub-mount 60 is provided with a chip fixture mount, and a conductor layer constituting a wire connection pad extended from the chip fixture mount, having a wider tip portion although not shown.

Meanwhile, three lengths of leads 61a, 61b, and 61c are fixedly attached to the stem 51. The two lengths thereof, the leads 61a, 61b, are fixedly attached to the stem 51 in such a state as penetrating the same via an insulator 62, respectively. The lead 61c, the remaining one length of the three lengths thereof, is fixedly attached to the second face of the stem 51, that is, the face thereof, on the opposite side of the first face, in a state as-butted against the second face, and is in a potential state electrically equivalent to the stem 51.

The first electrode (p-electrode) 22 (not denoted by reference numeral) of the semiconductor laser device 1 is fixedly attached to the chip fixture mount of the sub-mount 60 with an electrically conductive joining material interposed therebetween. Accordingly, the second electrode (an n-electrode) 23 is positioned on a side of the semiconductor laser device 1, where the second face thereof is exposed, so that the second electrode (an n-electrode) 23 is connected to the heat sink 59 via an electrically conductive wire 63a. By so doing, the second electrode (an n-electrode) 23 of the semiconductor laser device 1 is electrically connected to the lead 61c. Further, the wire connection pad with the wider tip portion, extended from the chip fixture mount (not shown) provided on the surface of the sub-mount 60, is electrically connected to the tip of the lead 61b penetrating through the stem 51, protruding on the first face side thereof via an electrically conductive wire 63b. As a result, the first electrode (p-electrode) 22 of the semiconductor laser device 1 is electrically connected to the lead 61b.

As described above, there is formed a structure wherein the heat sink 59, respective portions of the leads 61a, 61b, the sub-mount 60, the semiconductor laser device 1, and the electrically conductive wires 63a, 63b, disposed on the first face side of the stem 51, are covered by the cap 52.

With the semiconductor laser apparatus 50, upon application of a predetermined voltage across the leads 61b, 61c, a laser bean is emitted from an end face of the semiconductor laser device 1, and the laser bean is radiated to the outside of the stem 51 after transmitting through the window 58.

Since the semiconductor laser apparatus 50 is an optical semiconductor apparatus with the semiconductor laser device 1 assembled in the package 53 thereof, there is no risk that gold is diffused into the ridge of the semiconductor laser device 1 to thereby cause degradation in the characteristics of the semiconductor laser device 1, so that reliability of the semiconductor laser apparatus (optical semiconductor apparatus) can be enhanced.

With the present embodiment, the window 58 is used as an optical system for guiding the laser beam emitted from the emitting face of the semiconductor laser device 1 to the outside of the package 53; however, other optical systems, such as an optical fiber, lens, and so forth, may be used instead. Further, use is made of the wires as connecting means for electrically connecting the electrodes of the semiconductor laser device 1 to the respective leads; however, other connecting means may be used instead.

The embodiment 1 of the invention has the following advantageous effects.

(1) In the formation of the barrier metal layer, the respective side faces of the ridge 12 are already covered with the insulating film 20, the respective side faces of the contact layer 9a of the ridge, constituting the upper part of the ridge 12, are the tilted faces 17a, 17b, and the angles formed by the top face 17c of the contact layer 9a of the ridge, and the tilted faces 17a, 17b, respectively, become obtuse angles, so that the portion of the contact layer 9a of the ridge, on the top face side thereof, can be reliably covered with the barrier metal layer 21.

(2) In the formation of the ridge, after forming the contact layer 9a of the ridge, and the contact layers 9b of the fields by etching the p-type contact layer 9, both the side faces of the contact layer 9a of the ridge are formed so as to become the tilted faces 17a, 17b, respectively. Thereafter, etching is applied twice, including the dry etching and the wet etching each once, with the use of the contact layer 9a of the ridge, and the contact layers 9b of the fields, serving as the masks, to thereby form the separation grooves 10, 11. As a result, the extremities of the contact layer 9a of the ridge, on the respective sides thereof, constituting the tilted faces 17a, 17b, respectively, are structured so as to jut out into the separation grooves 10, 11, respectively; however, at least the undersides of the jutting out extremities of the contact layer 9a of the ridge, respectively, are covered with the insulating film 20. Further, the side faces of a portion of the p-type cladding layer (the second layer of the second cladding layer) 8, forming a portion of the ridge, on the underside of the contact layer 9a of the ridge, are covered with portions of the insulating film 20, respectively, and the respective portions of the insulating film 20 jut out further from the jutting out extremities of the contact layer 9a of the ridge, on the respective sides thereof, toward the respective separation grooves 10, 11. As a result, the barrier metal layer 21 covering the contact layer 9a of the ridge overlaps the respective portions of the insulating film 20, jutting out from the respective sides of the contact layer 9a of the ridge. Accordingly, a portion of the barrier metal layer 21, facing the contact layer 9a of the ridge, is linked with the respective portions of the insulating film 20 to thereby cover the contact layer 9a of the ridge in such a way as to wrap the same up. Hence, the contact layer 9a of the ridge is prevented from coming into contact with the first electrode (p-electrode) 22 formed of Au, so that diffusion of Au into the contact layer 9a of the ridge can be deterred. Accordingly, the semiconductor laser device 1 having excellent characteristics can be manufactured.

(3) Because formation of the contact hole for electrically connecting the first electrode (p-electrode) 22 to the contact layer 9a of the ridge is executed by etching of the insulating film 20 by use of a self-alignment process after the exposure and development of the contact-resist 43, it is possible to form the contact hole accurately above the ridge. It follows that the contact hole can be accurately formed even when the ridge 12 is rendered further narrower.

(4) Because the formation of the multi-layer growth layers on top of the semiconductor substrate is implemented by the MOCVD applied once, the number of the process steps is reduced, thereby enabling a production cost to be lowered.

(5) Because the semiconductor laser apparatus 50 is an optical semiconductor apparatus with the semiconductor laser device 1 having advantageous effects described under items (1), (2) as above, assembled inside the package 53, there is no risk that gold is diffused into the ridge of the semiconductor laser device 1 to thereby cause degradation in the characteristics of the semiconductor laser device 1, so that reliability of the optical semiconductor apparatus is enhanced.

Having specifically described the invention developed by the inventor on the basis of the embodiment of the invention, as above, it is believed obvious that the invention is not limited to the embodiment described in the foregoing and that various changes and modifications may be made in the invention without departing from the spirit and scope thereof. For example, with the embodiment described, there is described a case where Pt is used for the barrier metal layer; however, the same effect as that of the embodiment can be obtained even if a conductor layer made of Ni, Pd, Mo, or other elements is used for the barrier metal layer.

Further, with the embodiment, there is described the case where the present invention is applied to a semiconductor laser device in the wavelength band of 0.6 μm; however, the present invention is similarly applicable to an optical semiconductor apparatus incorporating another semiconductor laser device, for example, a long-wavelength semiconductor laser device (in wavelength bands of 1.3 μm and 1.5 μm, respectively) for use in optical communications.

What is claimed is:

1. An optical semiconductor device comprising:
a semiconductor substrate of a first conductivity type, having a first face, and a second face that is a face on a side of the semiconductor substrate, opposite from the first face;
a first cladding layer made up of a semiconductor layer of the first conductivity type and formed over the first face of the semiconductor substrate;
an active layer formed on top of the first cladding layer;
a second cladding layer made up of a semiconductor layer of a second conductivity type and formed on top of the active layer;
a contact layer made up of a semiconductor layer of the second conductivity type and formed over the second cladding layer;
an insulating layer covering the second cladding layer to expose the contact layer;
a barrier metal layer made of metal contact layer and connecting to the exposed contact layer;
a first electrode comprising a Au plating layer and formed on top of the barrier metal layer; and
a second electrode formed on the second face of the semiconductor substrate,
wherein the two separation grooves are formed in layers and comprise the second cladding layer and contact layer over the active layer, whereby a ridge in a stripe-like shape between two separation grooves is formed,
wherein a side part of the contact layer comprises an extremity,
wherein the extremity of the side part of the contact layer overhangs the separation groove, underlies the insulating film, and comprises a tilted face undergoing gradual decrease in thickness toward the two separation grooves,
wherein the first tilted angle formed between the top face and the first tilted face and the second angle of the contact layer between the top face and the second tilted face are each defined as an obtuse angle,
wherein the barrier metal layer is further formed to directly cover the contact layer of the ridge, and is formed directly on the insulating film, and
wherein the insulating layer overhangs the separation groove.

2. An optical semiconductor device according to claim 1, wherein the side parts of the top face of the portion of the contact layer, having the extremities thereof, facing the separation grooves, respectively, are structured so as to jut out into the separation grooves, respectively.

3. An optical semiconductor device according to claim 1, wherein a portion of the barrier metal layer, covering the portion of the contact layer, constituting the ridge, is continuously linked with portions of the insulating film covering the respective side faces of the ridge, and the surface of the portion of the contact layer, constituting the ridge, is not exposed from the barrier metal layer, and the insulating film.

4. An optical semiconductor device according to claim 1, wherein the first electrode formed on top of the barrier metal layer is an Au-containing layer.

5. An optical semiconductor device according to claim 1, wherein the active layer has a multiple quantum well structure.

6. An optical semiconductor device according to claim 1, wherein a buffer layer made up of a semiconductor layer of the first conductivity type is formed on the first face of the semiconductor substrate, and the first cladding layer is formed on top of the buffer layer.

7. An optical semiconductor device according to claim 1, wherein the second cladding layer comprises a first layer of a second cladding layer formed on the top face of the active layer, and a second layer of the second cladding layer formed underside of the contact layer while an etch-stop layer made up of a semiconductor layer of the second conductivity type, and formed of a constituent material lower in etching rate. than the second layer of the second cladding layer, is formed between the first layer of the second cladding layer, and the second layer of the second cladding layer, respective bottoms of the separation grooves being formed by the etch-stop layer.

8. An optical semiconductor device according to claim 1, wherein grooves running along the separation grooves, respectively, are provided on side edges of the semiconductor substrate, on the first face side thereof, respectively, so as to be extended from one end of the semiconductor substrate to the other end thereof, and the grooves are provided so as to reach an intermediate layer of the second cladding layer, respective side faces of the grooves, on a side thereof, adjacent to the ridge, and respective bottoms of the grooves being covered by the barrier metal layer.

9. An optical semiconductor device according to claim 1, wherein the semiconductor substrate is made up of a GaAs substrate, the first cladding layer is made up of an AlGaInP layer, the active layer has a multiple quantum well structure comprising an AlGaInP layer serving as a barrier layer, and a GaInP layer serving as a well layer, the second cladding layer is made up of an AlGaInP layer, the contact layer is made up of a GaAs layer, the first face of the semiconductor substrate is a crystal face tilted from the crystal face (001) of a GaAs crystal, and each of the tilted faces at the side parts of the top face of the portion of the contact layer, facing the separation grooves, respectively, is the crystal face (111) of the GaAs crystal.

10. An optical semiconductor device according to claim 6, wherein the buffer layer is made up of a GaAs layer.

11. An optical semiconductor apparatus comprising:
a package;
a plurality of leads extended inside and outside of the package;
an optical semiconductor device attached to a sub-mount having conductivity, disposed inside the package;
connecting means for electrical connection between respective electrodes of the optical semiconductor device, and the leads, respectively; and
an optical system for guiding a laser beam emitted from an emitting face of the optical semiconductor device to the outside of the package,
said optical semiconductor device comprising:
a semiconductor substrate of a first conductivity type, having a first face, and a second face that is a face on a side of the semiconductor substrate, opposite from the first face;
a first cladding layer made up of a semiconductor layer of the first conductivity type and formed over the first face of the semiconductor substrate;
an active layer formed on top of the first cladding layer;
a second cladding layer made up of a semiconductor layer of a second conductivity type and formed on top of the active layer;
a contact layer made up of a semiconductor layer of the second conductivity type and formed over the second cladding layer;
an insulating layer covering the second cladding layer to expose the contact 1ayer;
a barrier metal layer made of metal contact layer and connecting to the exposed contact layer;
a first electrode comprising a Au plating layer and formed on top of the barrier metal layer; and
a second electrode formed on the second face of the semiconductor substrate,
wherein the two separation grooves are formed in layers and comprise the second cladding layer and contact layer over the active layer, whereby a ridge in a stripe-like shape between two separation grooves is formed,
wherein a side part of the contact layer comprises an extremity,
wherein the extremity of the side part of the contact layer overhangs the separation groove, underlies the insulating film, and comprises a tilted face undergoing gradual decrease in thickness toward the two separation grooves,
wherein the first tilted angle formed between the top face and the first tilted face and the second angle of the contact layer between the top face and the second tilted face are each defined as an obtuse angle,
wherein the barrier metal layer is further formed to directly cover the contact layer of the ridge, and is formed directly on the insulating film, and
wherein the insulating layer overhangs the separation groove.

12. An optical semiconductor apparatus according to claim 11, wherein a buffer layer made up of a semiconductor layer of the first conductivity type is provided between the semiconductor substrate and the first cladding layer, the active layer has a multiple quantum well structure, a structure formed by sequentially stacking a first layer of the second cladding layer made up of a semiconductor layer of the second conductivity type, an etch-stop layer made up of a semiconductor layer of the second conductivity type, and a second layer of the second cladding layer made up of a semiconductor layer of the second conductivity type is provided between the active layer and the contact layer, the etch-stop layer is made of a constituent material not to be etched while the second layer of the second cladding layer is being etched, or a constituent material lower in etching rate than the second layer of the second cladding layer, and the separation grooves each separate respective portions of the contact layer, and the second layer of the second cladding layer, from each other, respective bottoms of the separation grooves being formed by the etch-stop layer.

13. An optical semiconductor apparatus according to claim 12, wherein said optical semiconductor device comprises the semiconductor substrate made up of a GaAs substrate, the buffer layer made up of a GaAs layer, the first cladding layer made up of an AlGaInP layer, the active layer of the multiple quantum well structure comprising an AlGaInP layer serving as a barrier layer, and a GaInP layer serving as a well layer, the first layer of the second cladding layer made up of an AlGaInP layer, the etch-stop layer made up of a GaInP layer, the second layer of the second cladding layer made up of an A1GaInP layer, the contact layer made up of a GaAs layer, and the first face of the semiconductor substrate is a crystal face tilted from the crystal face (001) of a GaAs crystal, each of the tilted faces at the side parts of the top face of the portion of the contact layer, facing the separation grooves, respectively, being the crystal face (111) of the GaAs crystal.

14. An optical semiconductor apparatus according to claim 11, wherein the package comprises a stem made up of a metal plate having a first face, and a second face, that is, a face on the opposite side of the first face, and a cap in a hat-like shape, fixed to the first face of the stem, in such a way as to cover the same, a hole is provided in the ceiling of the cap, opposed to the first face of the stem, the hole being closed with a transparent glass sheet to thereby form a window, the stem is provided with a plurality of leads constituting external electrode terminals, penetrating the stem from the first face to the second face thereof to be fixedly attached to the stem via an insulator, respectively, the stem is further provided with a lead constituting an external electrode terminal, electrically connected to the second face, and extended along the plurality of the leads, a heat sink made of a metal is fixedly attached to the first face of the stem, the sub-mount is fixedly attached to a side face of the heat sink, the first electrode of said optical semiconductor device is fixedly attached to the sub- mount through the intermediary of the joining material, the second electrode of said optical semiconductor device is connected to the lead electrically connected to the second face of the stem, via an electrically conductive wire, the cap covers respective portions of the leads, the heat sink, said optical semiconductor device, and wires, positioned on the first face of the stem, and a laser beam emitted from an emitting face, that is, an end face of said optical semiconductor device is radiated to the outside of the package through the window.

* * * * *